(12) United States Patent
Jiang et al.

(10) Patent No.: US 8,187,678 B2
(45) Date of Patent: May 29, 2012

(54) ULTRA-THIN MICROPOROUS/HYBRID MATERIALS

(75) Inventors: Ying-Bing Jiang, Albuquerque, NM (US); Joseph L. Cecchi, Albuquerque, NM (US); C. Jeffrey Brinker, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 673 days.

(21) Appl. No.: 12/271,719

(22) Filed: Nov. 14, 2008

(65) Prior Publication Data

US 2010/0178468 A1    Jul. 15, 2010

Related U.S. Application Data

(63) Continuation-in-part of application No. 11/673,190, filed on Feb. 9, 2007, now Pat. No. 7,947,579.

(60) Provisional application No. 60/772,572, filed on Feb. 13, 2006, provisional application No. 60/988,180, filed on Nov. 15, 2007.

(51) Int. Cl.
*H05H 1/00* (2006.01)
*H05H 1/24* (2006.01)
*C04B 41/00* (2006.01)
*C23C 16/00* (2006.01)

(52) U.S. Cl. ..... 427/535; 427/532; 427/569; 427/255.28

(58) Field of Classification Search ................... 427/535, 427/569, 255.28
See application file for complete search history.

(56) References Cited

U.S. PATENT DOCUMENTS

| | | | |
|---|---|---|---|
| 6,875,687 B1 | 4/2005 | Weidman et al. | |
| 7,135,402 B2 | 11/2006 | Lin et al. | |
| 7,223,473 B2 | 5/2007 | Jiang et al. | |
| 2003/0150811 A1 | 8/2003 | Walter et al. | |
| 2005/0271809 A1* | 12/2005 | Kobrin et al. | 427/248.1 |
| 2007/0161230 A1* | 7/2007 | Chen et al. | 438/637 |

FOREIGN PATENT DOCUMENTS

| WO | 200243937 | 6/2002 |
|---|---|---|
| WO | WO 2005100452 A1 * | 10/2005 |
| WO | WO 2006097525 A2 * | 9/2006 |

OTHER PUBLICATIONS

Sukjoon et al, Synthesis and characterization of uniform alumina-mesoporous silica hybrid membranes, Langmuir, 2006, 1839-1845.*
Clark et al, A new application of UV-ozone treatment in the preparation of substrate-supported, mesoporous thin films, Chem. Mater., 2000, 12, 3879-3884.*

(Continued)

*Primary Examiner* — Dah-Wei Yuan
*Assistant Examiner* — Nga Leung V Law
(74) *Attorney, Agent, or Firm* — MH2 Technology Law Group LLP

(57) ABSTRACT

Ultra-thin hybrid and/or microporous materials and methods for their fabrication are provided. In one embodiment, the exemplary hybrid membranes can be formed including successive surface activation and reaction steps on a porous support that is patterned or non-patterned. The surface activation can be performed using remote plasma exposure to locally activate the exterior surfaces of porous support. Organic/inorganic hybrid precursors such as organometallic silane precursors can be condensed on the locally activated exterior surfaces, whereby ALD reactions can then take place between the condensed hybrid precursors and a reactant. Various embodiments can also include an intermittent replacement of ALD precursors during the membrane formation so as to enhance the hybrid molecular network of the membranes.

20 Claims, 15 Drawing Sheets

OTHER PUBLICATIONS

Voorthuyzen et al, Invenstigation of the surface conductivity of silicon dioxide and methods to reduce it, Surface Science, 1987, 187, 201-211.*

Aparicio et al, Hybrid organic/inorganic sol-gel materials for proton conducting membranes, Journal of Sol-Gel Science and Technology, 2004, 31, 103-107.*

Hozumi et al, Low-temperature elimination of organic components from mesostructured orgainc-inorganic composite films using vacuum ultraviolet light, Chem. Mater., 2000, 12, 3842-3847.*

Solanki et al, Atomic layer deposition of ZnSe/CdSe superlattice nanowires, Applied Physices Letters, 2002, vol. 81 No. 20, 3864-3866.*

Riikka L. Puurunen, "Surface Chemistry of Atomic Layer Deposition: A Case Study for the Trimethylaluminum/Water Process", 2005, Journal of Applied Physics, vol. 97, pp. 1-52.

H. Kim, "THe Application of Atomic Layer Deposition for Metallization of 65 nm and Beyond", Aug. 19, 2005, Surface and Coatings Technology, vol. 200, pp. 3104-3111.

International Search Report, International Application No. PCT/US2008/083688, Korean Intellectual Property Office International Searching Authority, Jul. 31, 2009, 3 Pages.

H. Kim, "Atomic layer deposition of metal and nitride thin films: Current research efforts and applications for semiconductor device processing", J. Vac. Sci. Technol. B, 21(6), Nov./Dec. 2003, pp. 2231-2261.

Jiang, Ying-Bing, Nanguo Liu, Henry Gerung, Joseph L. Cecchi and Jeffrey C. Brinker, "Nanometer-Thick Conformal Pore Sealing of Self-Assembled Mesoporous Silica by Plasma-Assisted Atomic Layer Deposition," Journal of the American Chemical Society, Aug. 2006, vol. 128, pp. 11018-11019.

Dow-Chemical Online, "Porous SiLK*Y Semiconductor Dielectric Resin—Small Closed-cell Pore Size," Jun. 12, 2009, pp. 1-3, http://www.dow.com/silk/silky/small.htm.

* cited by examiner

ULTRA-THIN MICROPOROUS/HYBRID MATERIALS

RELATED APPLICATIONS

This application is a continuation-in-part of U.S. patent application Ser. No. 11/673,190 filed Feb. 9, 2007 now U.S. Pat. No. 7,947,579, entitled "Method of Making Dense, Conformal, Ultra-Thin Cap Layers for Nanoporous Low-k ILD by Plasma Assisted Atomic Layer Deposition," which is hereby incorporated by reference in its entirety, which claims priority from U.S. Provisional Patent Application Ser. No. 60/772,572, filed on Feb. 13, 2006, which is hereby incorporated by reference in its entirety.

This application also claims priority from U.S. Provisional Patent Application Ser. No. 60/988,180, filed on Nov. 15, 2007, which is hereby incorporated by reference in its entirety.

GOVERNMENT RIGHTS

This invention was made with Government support under Grant No. EY-16570 awarded by the National Institutes of Health, and Grant No. DE-FG02-02ER15368 awarded by the Department of Energy. The U.S. Government has certain rights in this invention.

DESCRIPTION OF THE INVENTION

1. Field of the Invention

The present invention relates generally to membranes and, more particularly, to methods for forming organic/inorganic hybrid membranes and microporous membranes using successive surface activation and reaction steps.

2. Background of the Invention

Membranes, such as synthetic membranes, that exhibit high flux and high selectivity, are demanded for many applications including water desalination, greenhouse gas storage and abatement, $H_2$ purification, and selective proton/oxygen conduction in fuel cells. In natural systems, high flux and high selectivity are achieved by membrane bound ion and molecular channels—whose pore size is defined with sub-nanometer precision through protein folding and whose thickness is limited to that of the cellular membrane bilayer of about 4 nm.

Inspired by natural systems, it is desirable for synthetic membranes to be fabricated having molecular level precision porosities and having controlled thin thicknesses. Among synthetic membranes, carbon nanotube (CNT) membranes and zeolite membranes can provide similar molecular level precision porosities. These membranes, however, have a thickness of about 100-1000 times thicker than that of natural membranes, due to that synthetic approaches require thick membranes in order to avoid defects. Membrane flux, however, varies reciprocally with membrane thickness.

Atomic layer deposition (ALD) is a self-limiting layer-by-layer thin film deposition technique. For example, ALD has focused principally on the formation of dense thin film oxides, metals, or semiconductor alloys on solid substrates. FIG. 1 depicts a cross section of a portion of a porous material 110 that includes a plurality of pores 120. Conventional ALD forms a barrier layer 130 on the surface of porous material 110, but also forms film 135 within the internal pores thereby increasing the effective k value of porous material 110.

During ALD deposition, a chemisorbed monolayer of precursor molecules can be converted into a solid deposition on the sample surface. The resulting thin films are consequently conformal to intricate surface morphologies. And their thickness increment after each ALD cycle is substantially constant and at an atomic level, making it easy to precisely control the film thickness and obtain film thicknesses of a few nanometer. In addition, the ALD films are substantially uniform over a large area due to the self-limiting deposition mechanism. These properties are ideal for membrane fabrication. In the past, ALD has focused on inorganic materials such as oxides, noble metals or transition metals, and semiconductor alloys. It would be desirable, however, to make organic/inorganic hybrid materials by ALD.

Thus, there is a need to overcome these and other problems of the prior art to provide ultra-thin hybrid and/or microporous membranes and methodologies for their fabrication.

SUMMARY OF THE INVENTION

According to various embodiments, the present teachings include a method for forming an ultra-thin material. The ultra-thin material can be formed by first locally activating an exterior surface of a porous support using a remote plasma irradiation, leaving a plurality of internal pore surfaces non-activated. The ultra-thin material can be formed by further depositing a hybrid precursor on the locally activated exterior surface using an atomic layer deposition (ALD) process, wherein the deposited hybrid precursor can react with a reactant and form a thin layer material on the exterior surface of the porous support.

Various embodiments can also include an intermittent replacement of ALD precursors during the formation of ultra-thin material so as to enhance the hybrid molecular network of the membranes.

According to various embodiments, the present teachings also include an ultra-thin material. The ultra-thin material can include a hierarchical porous support including a topographical feature and an ultra-thin hybrid layer conformally disposed on an exterior surface of the hierarchical porous support by an atomic layer deposition (ALD) process. The exterior surface can include an exposed surface of the topographical feature and an exposed surface of the hierarchical porous support.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
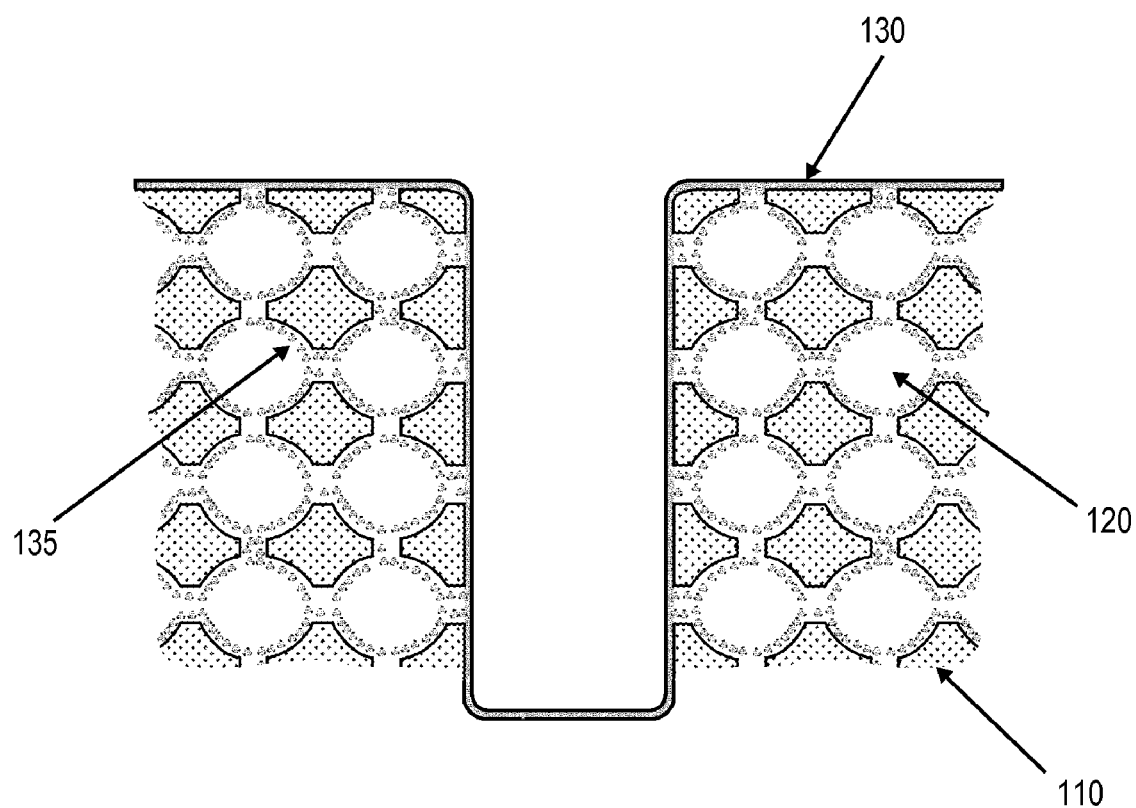
FIG. 1 depicts a barrier layer formed on a porous material by conventional ALD methods in which the internal pores are coated with film or portions of film.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. $-1$, $-1.2$, $-1.89$, $-2$, $-2.5$, $-3$, $-10$, $-20$, $-30$, etc.

According to various embodiments of the present teachings depicted in FIGS. 2-5B, methods for forming an ALD barrier layer localized to the immediate surface of a porous material are provided. In particular, a plasma-assisted ALD (PA-ALD) process is provided that can form a barrier layer on a porous, low-k material and seal the pores at minimal ILD thickness. As used herein, the term "barrier layer" is used interchangeably with the term "cap layer." A barrier layer formed according to the present teachings can seal the pores on a porous ILD material, function as a diffusion barrier, be conformal, localized, and/or have a negligible impact on the overall ILD k value. Being thin and defect free, the barrier layer could additionally be employed under some conditions as a semi-permeable membrane.

Figure 2:
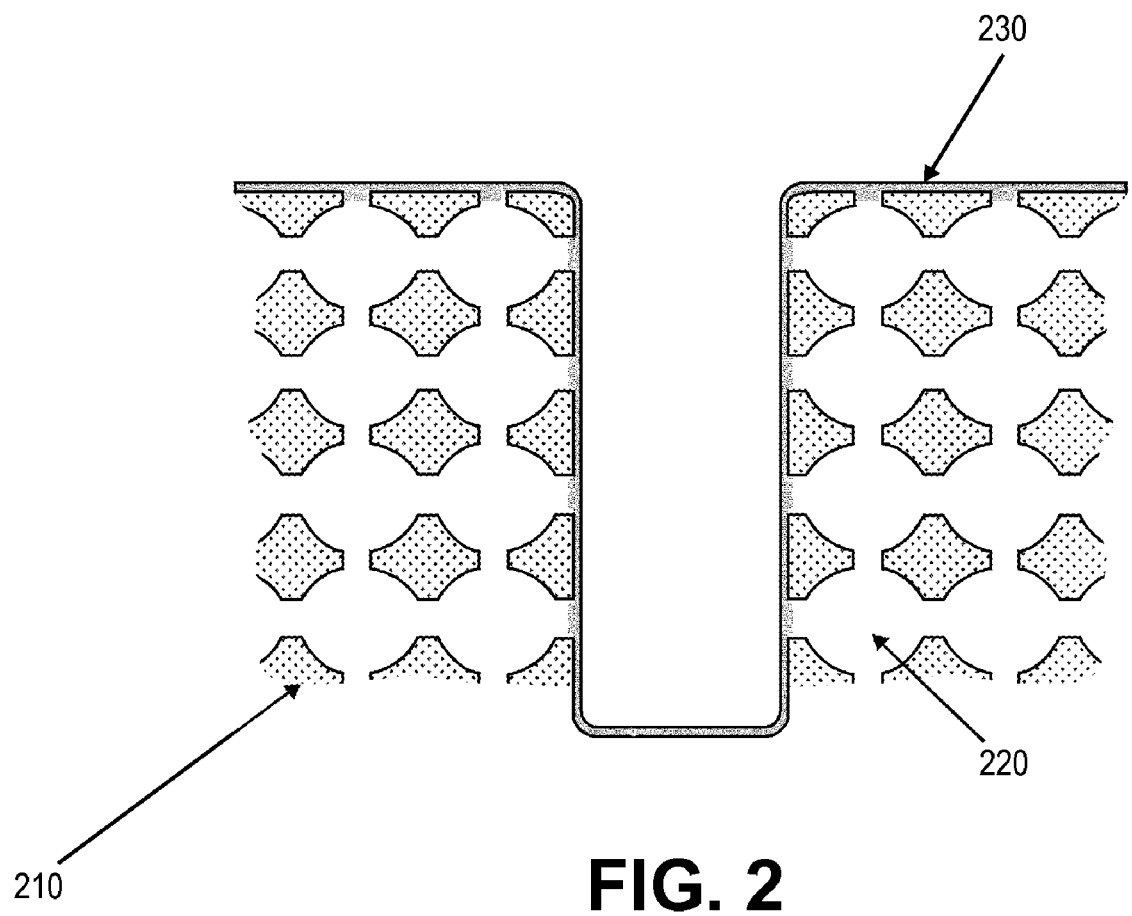
FIG. 2 depicts a barrier layer formed in accordance with the present teachings.

Referring to the cross sectional view of FIG. 2, an exemplary barrier layer 230 is shown. Barrier layer 230 can be disposed on a porous layer 210 that can include a plurality of pores 220. In an exemplary embodiment, porous layer 210 can be a low-k ILD formed of, for example, xero-gel silica or self-assembled surfactant-templated SiO2. Porous layer 210 can also be Al2O3, a metal, or other porous materials know to one of ordinary skill in the art. In various embodiments, the pores can be about several angstroms to tens of nanometers in diameter and can be arranged in regular lattice like a crystal. At elevated porosities, the pores 220 can be connected to each other. Porous layer 210 can further include 3D topology, for example, of patterned ILD layers. Barrier layer 230 can be a conformal layer that is confined to the surface of porous layer 210, seals the interior pores 220, and serves as a diffusion barrier. Because ALD processes can form one monolayer of the barrier layer at a time, the total thickness of barrier layer can be controlled so that its impact on the overall ILD k value is negligible.

Figure 3B:
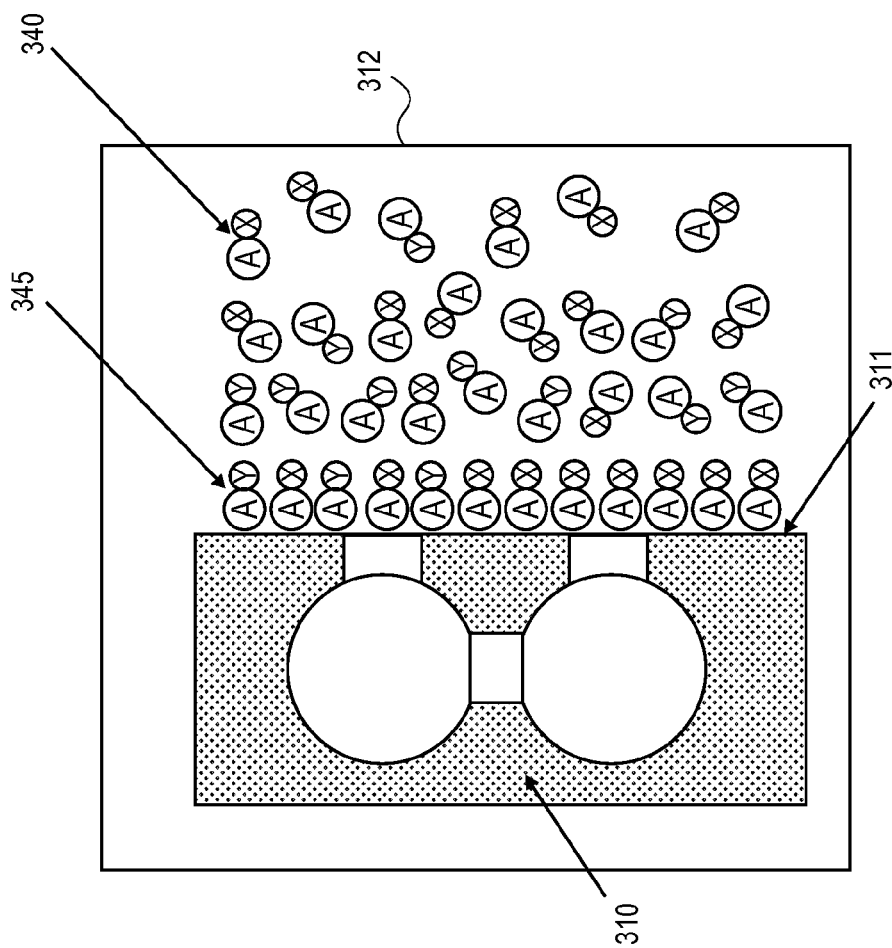
FIGS. 3A-3F depict steps in a method for forming a barrier layer in accordance with the present teachings.
Figure 3A:
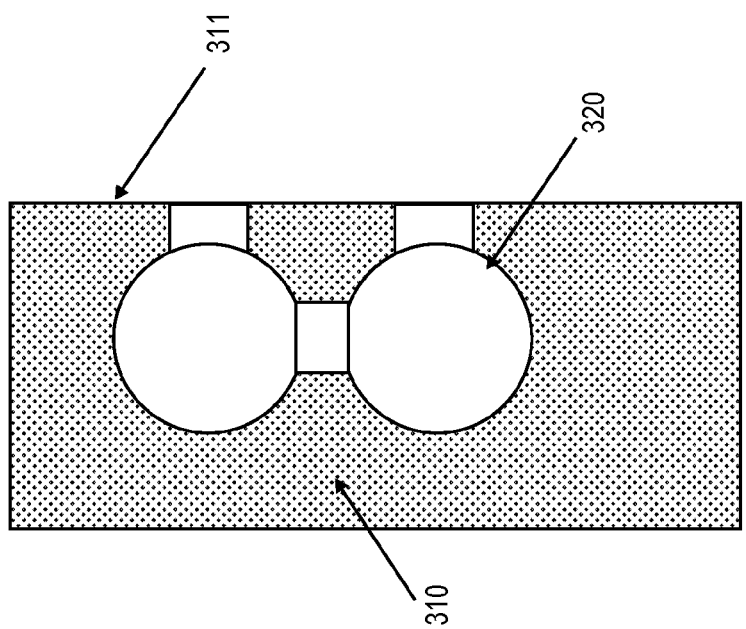

Turning now to exemplary methods for forming the barrier layers, FIGS. 3A-F schematically depict a plasma-assisted ALD process for forming a barrier layer on a porous material according to the present teachings. A portion of a porous material 310 including pores 320 and a surface 311 can be cleaned by methods known to one of ordinary skill in the art, rendering a surface as shown in FIG. 3A. Referring to FIG. 3B, porous material 310 can be placed in a reaction chamber 312 and precursor molecules 340 can be introduced. In various embodiments, precursor molecules can be gas molecules of AX. AX can be, for example, a gaseous or volatile (e.g., a volatile liquid) chemical including two or more elements or molecules that can provide one or more of the components in the objective barrier layer material. Precursor molecules 340 can adsorb onto surface 311 of porous material 310. A first layer of precursor molecules 345 can be chemically adsorbed and have a strong bond with surface 311. Subsequent precursor molecules can be physically adsorbed to first layer of precursor molecules 345, as well as weakly bonded to other precursor molecules 340.

Figure 3D:
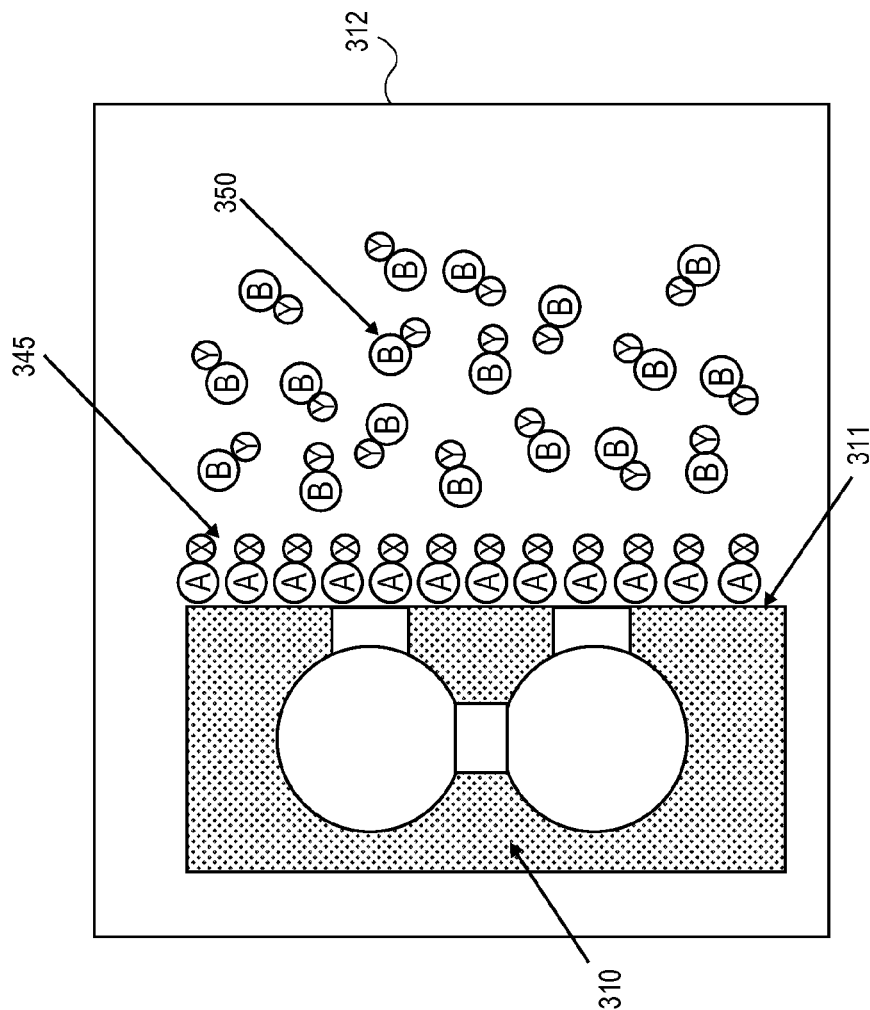
Figure 3C:
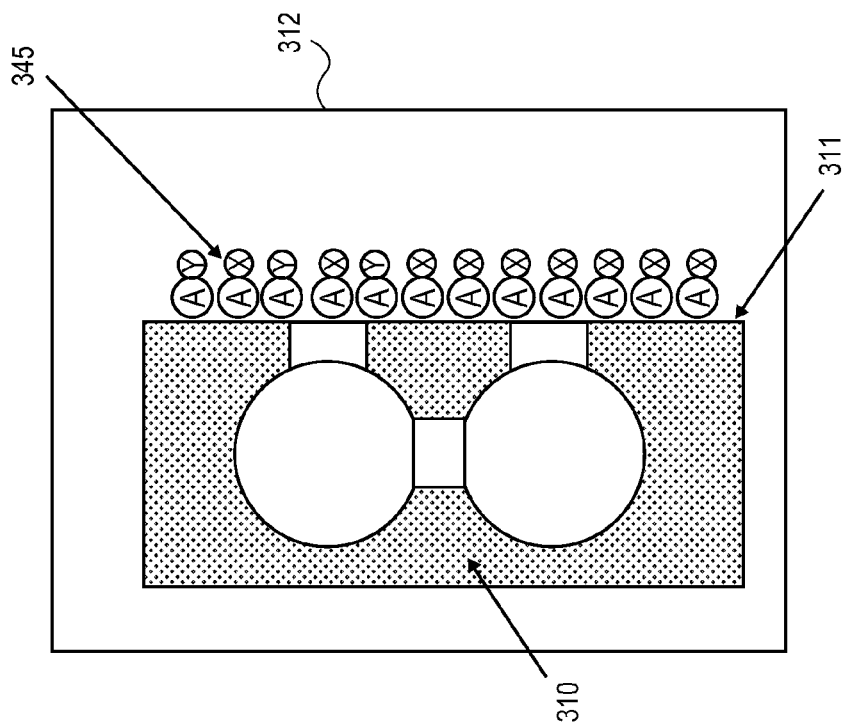

As shown in FIG. 3C, precursor molecules 340 can be removed and substantially a first monolayer 345 of precursor molecules chemically adsorbed to porous surface 311 can remain. Precursor molecules 340 can be removed by purging the chamber 312 with an inert gas, such as, for example, Ar or N2 or by evacuating the chamber 312. Referring to FIG. 3D, a plurality of reactant molecules 350 can be introduced into the chamber 312. Reactant molecules 350, for example, in a gaseous form BY can be selected to be non-reactive with precursor molecules 345 unless activated by a plasma. BY can be, for example, a gaseous or volatile (e.g., a volatile liquid) chemical including two or more elements or molecules that can react with AX under the influence of a plasma to form AB. One of ordinary skill in the art will understand that reactant molecules BY and precursor molecules AX are used for illustration purposes and that the reactant molecules and precursor molecules can be of other forms. For example, for a SiO2 barrier layer, the precursor molecules can be HMDS+O2, or TEOS+O2, or other volatile organic Si-precursors that are not pyrophoric in air at room temperatures. For a TiO2 barrier layer, the precursors can be Ti isopropoxide+O2, or other volatile organic Ti-precursors that are not pyrophoric in air at room temperatures. One of skill in the art will understand that other molecules for AX and BY that form a barrier layer by plasma assisted-ALD are contemplated.

In plasma-assisted ALD, ions, electrons, and radicals generally move along straight lines. Once they hit a wall, they will be neutralized and are thus no longer active. As such, plasma does not enter the nanopores and plasma-assisted ALD does not result in film deposition within the pores. Moreover, plasma-assisted ALD can be operated at room temperature further reducing film deposition within the pores. Plasma with low ion energies and a plasma source with controllable ion energy can be used to minimize sputtering of chemisorbed layers by ion bombardment.

Figure 3F:
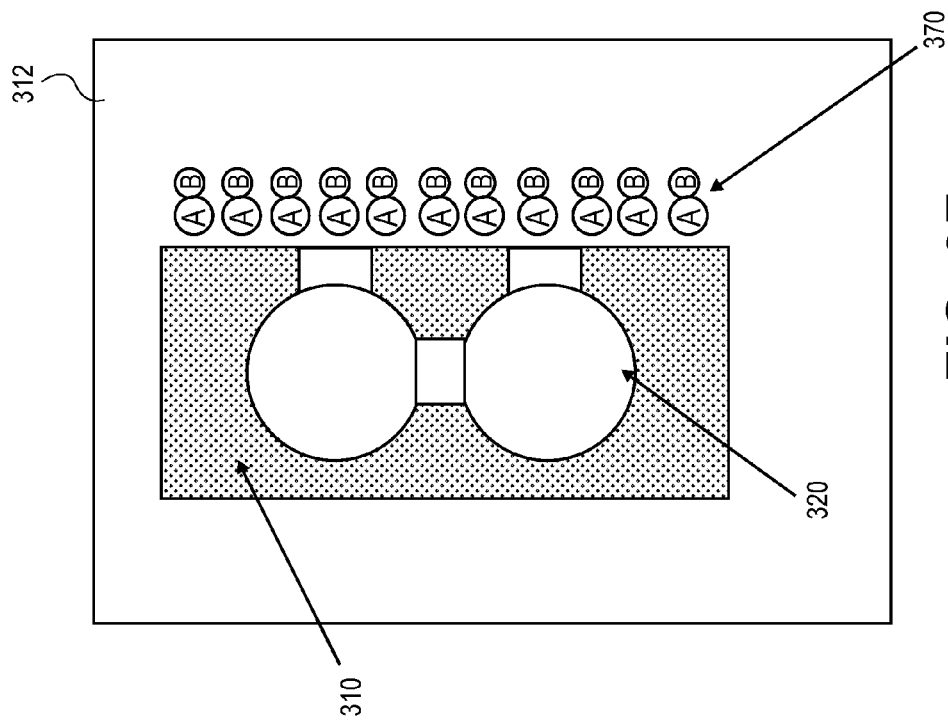
Figure 3E:
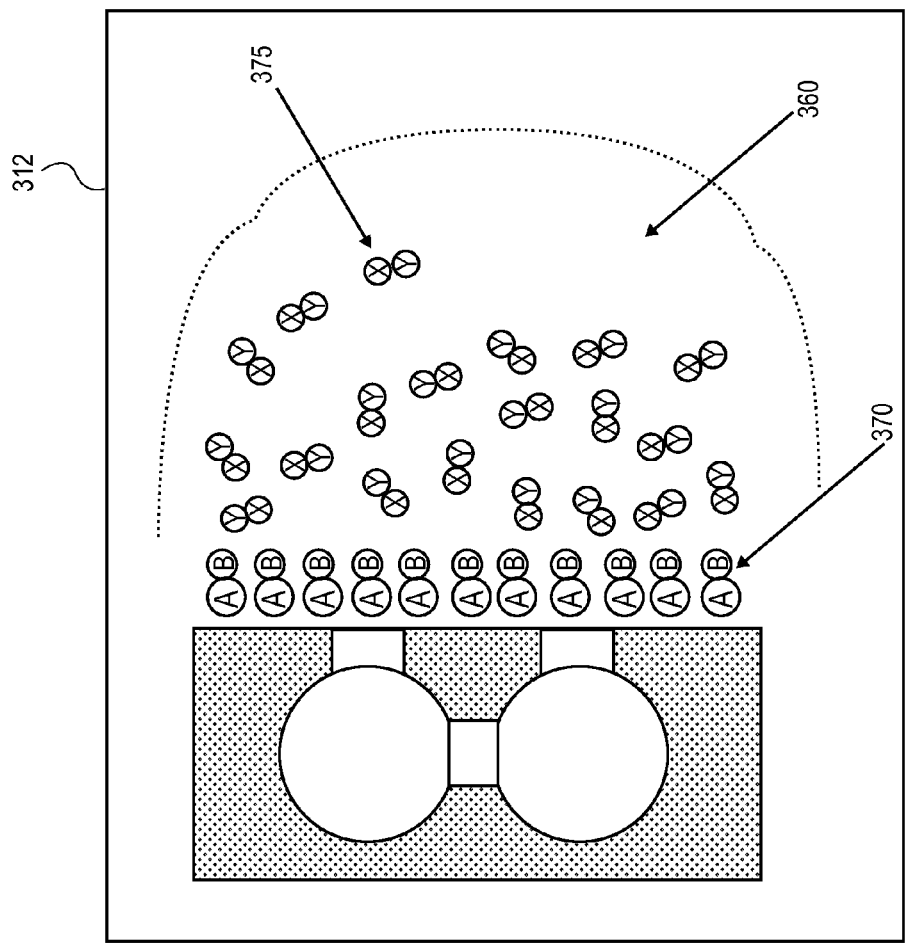

FIG. 3E shows that under the influence of a plasma 360, an ALD reaction can occur in which a barrier layer 370 can be formed of AB molecules. Molecules XY 375 can also form. Barrier layer 370 can be formed of substantially a monolayer of AB molecules, span the surface pores, be conformal to surface 311, be confined to the surface 311 of porous material 310, and/or seal the pores of porous material 310. While precursor molecules 340 can be present within the internal pores of porous material 310, they will not react with reactant molecules 350 because the plasma cannot penetrate (and ALD cannot occur) within the internal porosity. Therefore, no film or portion of film will be formed in the internal pores 320. For purposes of illustration, precursor molecules are not shown within the pores. The chamber 312 can then be purged with an inert gas or evacuated to remove the XY molecules 375 as shown in FIG. 3F. The steps depicted in FIGS. 3B to 3F can be repeated to form the desired thickness of barrier layer 370.

Exemplary methods for fabricating the barrier layers are provided below as Examples 1 and 2 and further explain use of and TEOS and HMDS.

Example 1

An exemplary plasma-assisted process in which ALD is confined to the immediate surface, allowing pore sealing at minimal ILD thickness is provided. The purpose of the plasma can be to define the location of ALD. If ALD precursors are chosen to be non-reactive unless activated by plasma, then, ALD can be spatially defined by the supply of plasma irradiation. In this regard one can recognize that the Debye length and the molecule mean free path in a typical plasma greatly exceed the pore dimension of a porous low-k material, thus plasma cannot penetrate (and ALD cannot occur) within the internal porosity.

The exemplary method was carried out in a modified plasma-assisted ALD (PA-ALD) system. The deposition chamber was a 25 mm diameter Pyrex tube, evacuated by a turbomolecular pump to a base vacuum of $5 \times 10^{-7}$ Torr. An RF coil surrounded the Pyrex tube for plasma generation. Samples were mounted in a remote plasma zone for reduced ion bombardment and plasma-heating effects. Oxygen and TEOS (tetraethylorthosilicate $Si(OCH_2CH_3)_4$) were used as the precursors for $SiO_2$. In the absence of plasma, they remain unreactive at room temperature. These precursors were admitted into the reactor alternately via pneumatic timing valves. A constant Ar flow of 15 scan was used as the carrier gas as well as the purging gas.

Figure 4A:
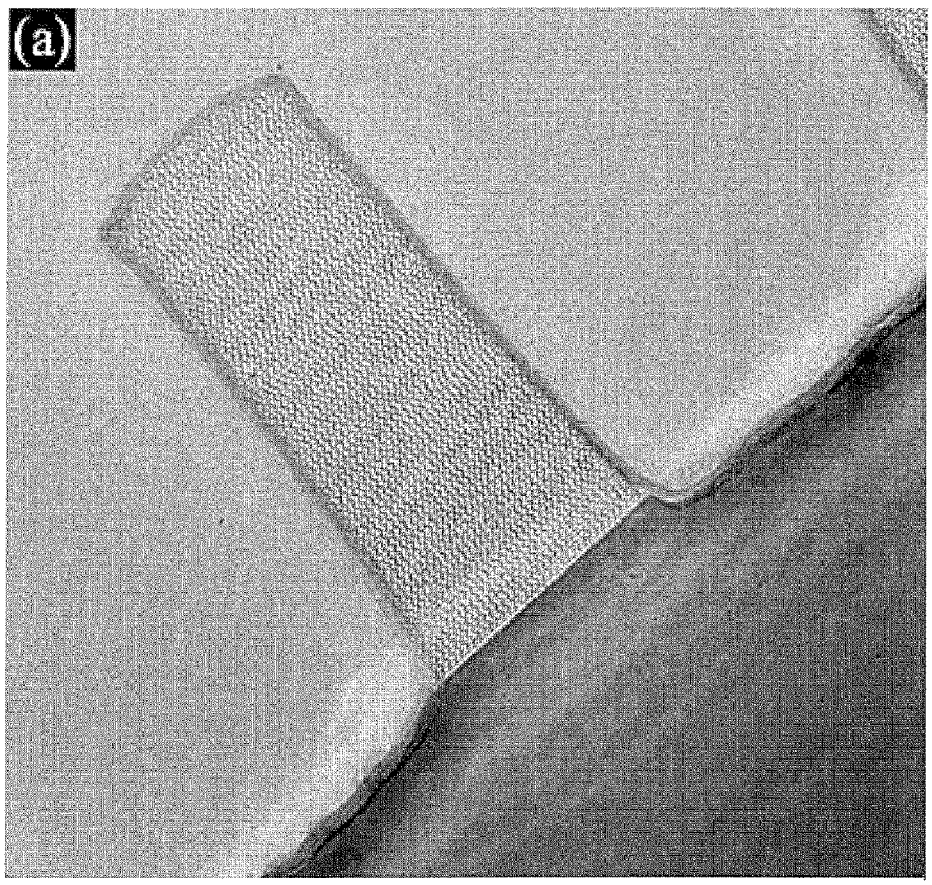
FIG. 4A is cross-sectional transmission electron microscope (TEM) image showing a conformal 5 nm thick pore-sealing coating of $SiO_2$ prepared on a patterned mesoporous low-k silica film in accordance with the present teachings.

The mesoporous silica thin film samples were prepared on silicon substrates by evaporation-induced self-assembly using Brij-56 as the surfactant to direct the formation of a cubic mesostructure characterized by a continuous 3D network of connected pores with diameters ~2 nm. These films exhibited excellent mechanical strength and thermal stability, along with an isotropic k and low surface roughness, which is important for etching or chemical mechanical polishing. At 50 volume % porosity, the k value can be 2.5 or less. Prior to PA-ALD, the samples were patterned by interferometric lithography and etched with a $CHF_3$/Ar plasma to create 400×400-nm trenches as shown in FIG. 4A. Then the photoresist and any residual organics were removed by oxygen-plasma treatment.

Plasma-assisted ALD was performed by first introducing TEOS vapor into the reactor, followed by Ar purging to obtain monolayer (or sub-monolayer) adsorption on the sample surface. RF power was then delivered to the coil, creating an $O_2$ and Ar plasma to produce active radicals that convert surface-adsorbed TEOS into reactive silanols and may promote further conversion to siloxane. After that, the deposition chamber was purged again to remove the residual gaseous products. The above steps were repeated 150 times, with each step lasting 5 seconds.

Figure 4B:
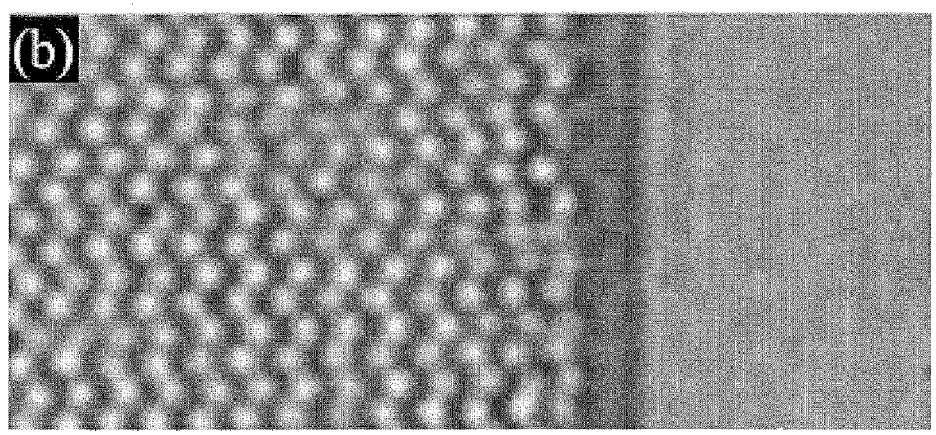
FIG. 4B is an enlarged cross-sectional TEM image showing the interface between a barrier layer and the mesoporous film in accordance with the present teachings.

FIGS. 4A and 4B show cross-sectional TEM images of the sample. A 5 nm thick $SiO_2$ coating is observed as the smooth dark rim bordering the patterned mesoporous silica feature. The coating was conformal to the patterned morphology and uniform in thickness. No penetration of the $SiO_2$ into the porous matrix was observed, and the interface between the coating and the mesoporous silica film remained sharp.

Figure 5A:
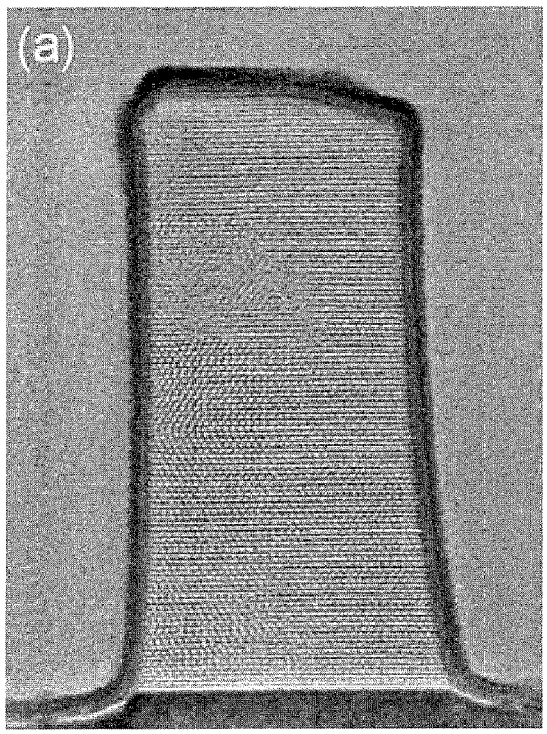
FIG. 5A is a cross-sectional TEM image showing the mesoporous sample treated by a plasma-assisted ALD (PA-ALD) pore-sealing process and then exposed to $TiO_2$ ALD conditions in accordance with the present teachings.
Figure 5B:
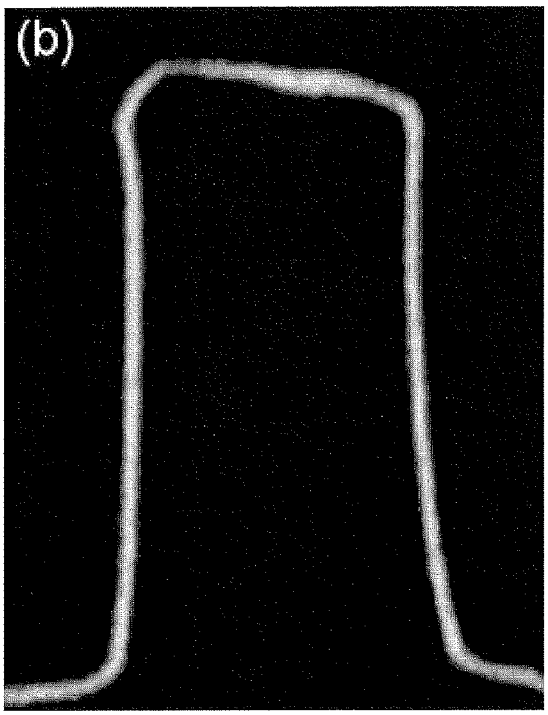
FIG. 5B is a Ti mapping image in the same area as that of FIG. 5A acquired with an electron-energy-loss image filtering mode.

To verify the pore-sealing effectiveness of PA-ALD, the PA-ALD coated sample was put into a traditional thermal ALD reactor, where $TiO_2$ ALD was performed. It was shown that standard $TiO_2$ ALD will infiltrate surfactant-templated mesoporous silica, so this experiment was conducted to demonstrate the effectiveness of PA-ALD pore sealing. At 180° C., the PA-ALD coated sample was treated with 100 thermal ALD cycles using $TiCl_4$ and $H_2O$ as the precursors. FIGS. 5A and 5-B show the corresponding TEM images. FIG. 5A is a regular cross-sectional TEM image, where two ALD layers were observed. The inner, lighter layer was the PA-ALD $SiO_2$ coating, and the outer, darker layer was the $TiO_2$ thermal ALD coating. The mesoporous low-k silica appeared completely unaffected, suggesting that $TiCl_4$ and $H_2O$ cannot penetrate through the PA-ALD $SiO_2$ coating to form $TiO_2$ in the underlying porous silica matrix. This was further supported by the Ti-mapping image in FIG. 5B. The bright border in this image represented the location of Ti, and corresponded to the $TiO_2$ overlayer shown in FIG. 5A. Comparing the Ti-mapping image (FIG. 5B) to the original regular TEM image (FIG. 5A), no detectable $TiO_2$ was found beyond the PA-ALD $SiO_2$ coating. Therefore, the PA-ALD $SiO_2$ coating, although only 5 nm thick, was pinhole-free and sufficiently dense to seal the pores and protect the underlying porous low-k silica from exposure to gaseous chemicals.

Concerning the mechanism of room temperature PA-ALD of $SiO_2$, it is first noted that the deposition rate is quite low, 0.03-nm/cycle, compared to 0.07-0.08-nm/cycle for conventional $NH_3$ catalyzed $SiO_2$ ALD. Conventional ALD uses multiple water/TEOS cycles, where a water exposure serves to hydrolyze ethoxysilane bonds to form silanols, and alkoxide exposure results in condensation reactions to form siloxane bonds. As for the related solution-based 'sol-gel' reactions, hydrolysis and condensation are bimolecular nucleophilic substitution reactions catalyzed by acid or base. In PA-ALD, plasma exposure can take the place of hydrolysis, activating the alkoxide surface toward TEOS adsorption. Silanols can form during PA-ALD. However due to the monolayer (or sub-monolayer) ≡Si—OH coverage, the extent of surface hydrolysis can be difficult to quantify. Additionally, the plasma can serve a catalytic role by generating nucleophilic oxo radicals, ≡Si—O. that promote siloxane bond formation. At room temperature the extent of these plasma assisted hydrolysis and condensation reactions can be less than for conventional ammonia catalyzed hydrolysis and condensation reactions, explaining the lower deposition rates. Consistent with a low rate of siloxane bond formation is the highly conformal and dense PA-ALD layer indicative of a reaction-limited monomer-cluster growth process-confined, as disclosed herein, exclusively to the plasma-activated surface.

Example 2

Higher PA-ALD deposition rates can be obtained by using precursors with stronger surface adsorptions, for example, using HMDS (Hexymethyldislazane, $(CH_3)_3SiNHSi(CH_3)_3$) compared of TEOS. HMDS has stronger chemisorption on a sample surface than TEOS due to its more reactive nature to —OH groups on the sample surface as further described below.

In this example, PA-ALD was carried out with the same apparatus as depicted in Example 1, but the precursors were HMDS and oxygen. The deposition procedures were also the same as the procedures in Example 1: first introducing HMDS vapor into the reactor, followed by Ar purging to obtain monolayer (or sub-monolayer) adsorption on the sample surface. RF power was then delivered to the coil, creating an $O_2$ and Ar plasma to produce active radicals that convert surface-adsorbed HMDS into reactive silanols and may promote further conversion to siloxane. After that, the deposition chamber was purged again to remove the residual gaseous products. Those steps were repeated for 60 cycles. To further enhance the step of precursor adsorption, the sample stage can be moderately heated up to 120° C. In addition, at the end of each PA-ALD cycle, the sample surface can be treated with $H_2O$ vapor to provide more —OH species for surface adsorption in the following cycle. The same cap layer as the one achieved in Example 1 was obtained in Example 2, but the deposition rate in Example 2 was about 0.106 nm/cycle, much faster than using TEOS.

Using HMDS has several advantages, including the following non-limiting examples: 1) it is easy to obtain monolayer adsorption because of its passivating —$CH_3$ final surface, thus a good PA-ALD cap layer can be attained over a broad experiment conditions; 2) HMDS is a common primer used before coating photoresist in semiconductor processing and is therefore a friendly chemical to microelectronics; and 3) HMDS has been used to cure the damaged low-k (e.g. damaged by intensive plasma during stripping photoresist). Thus, HMDS can automatically cure the damaged low-k at the same time when sealing the pores.

As described herein, PA-ALD can seal pores. Additionally with the demonstrated very high degree of thickness control, it is also contemplated that, prior to complete pore sealing, the pore size of the mesoporous silica can be progressively reduced in a sub-Å/cycle fashion. This combined with the thin PA-ALD layer thickness can have very important implications for membrane formation, where extremely thin inorganic films with precisely controlled pore size could enable the synthesis of robust mimics of natural ion or water channels of interest for sensors and water purification.

Figure 6:
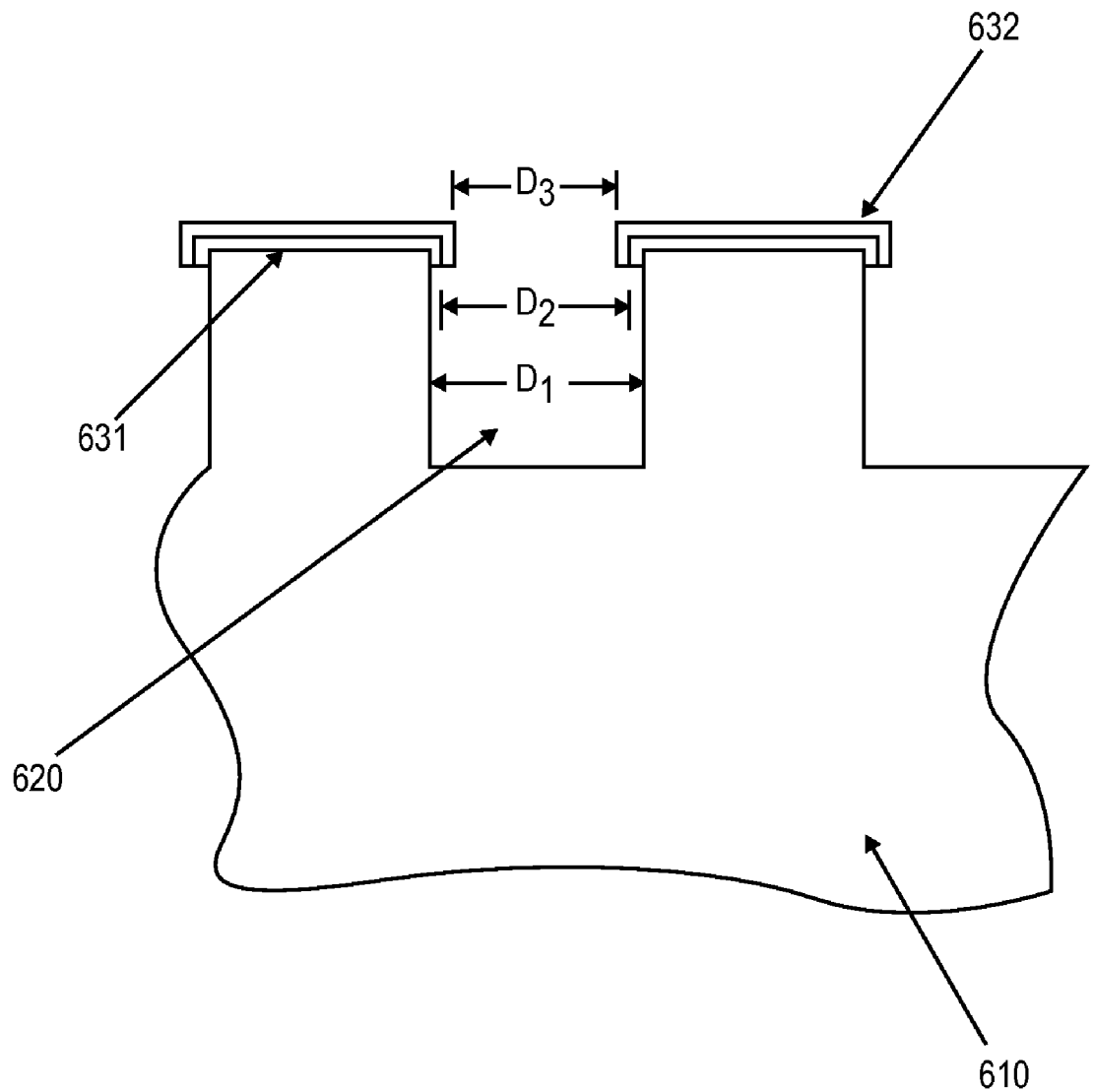
FIG. 6 is a cross sectional view of a method for reducing the diameter and/or the chemistry of pores in a porous material in accordance with the present teachings.
Figure 7B:
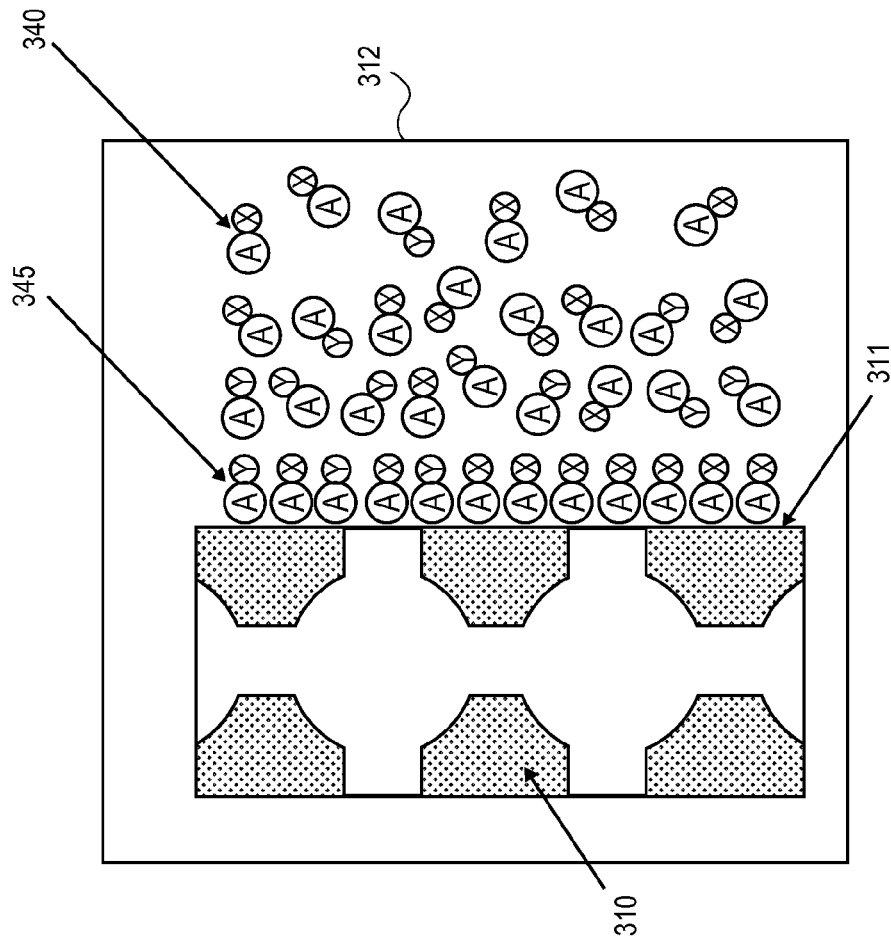
FIGS. 7A-7F depict steps in a method for forming an ultra-thin layer relative to FIGS. 3A-3F in accordance with the present teachings.
Figure 7A:
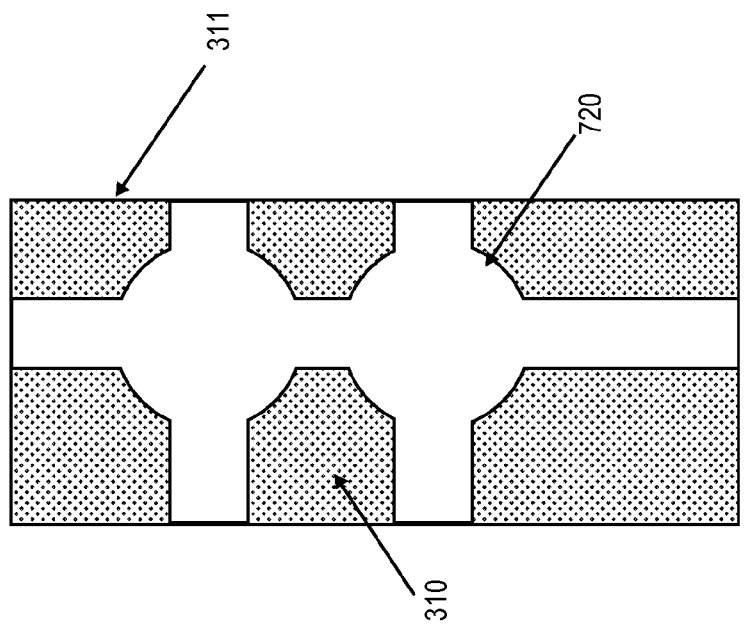
Figure 7D:
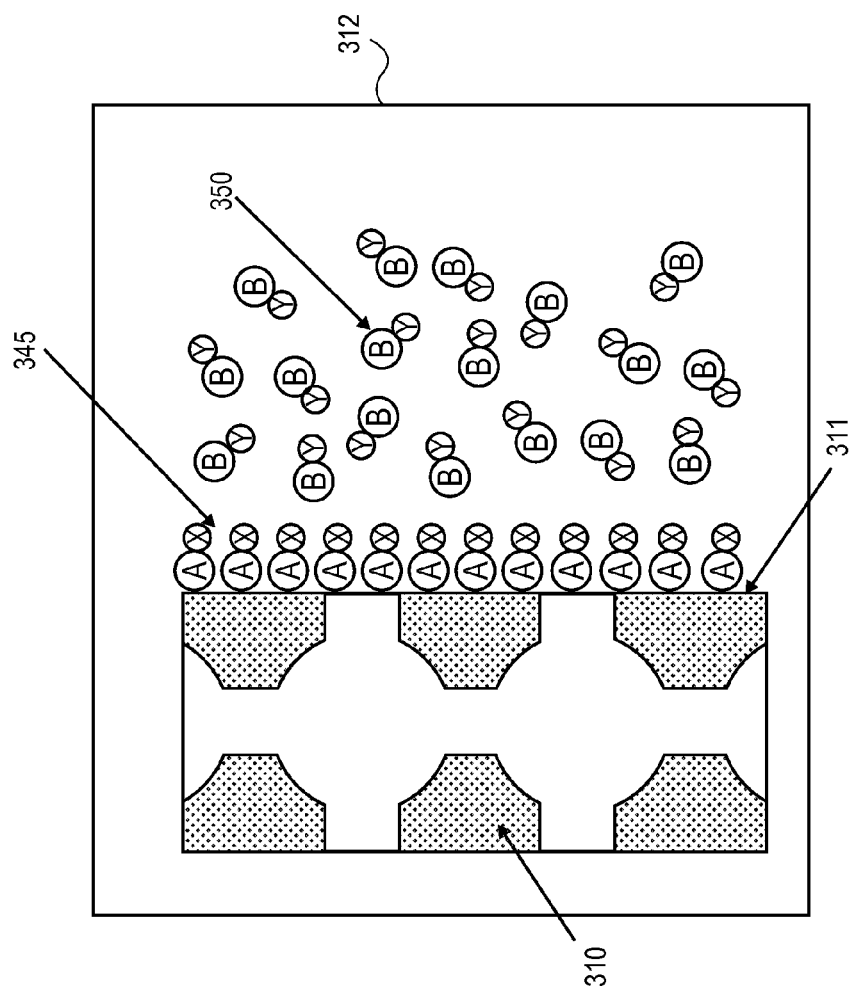
Figure 7C:
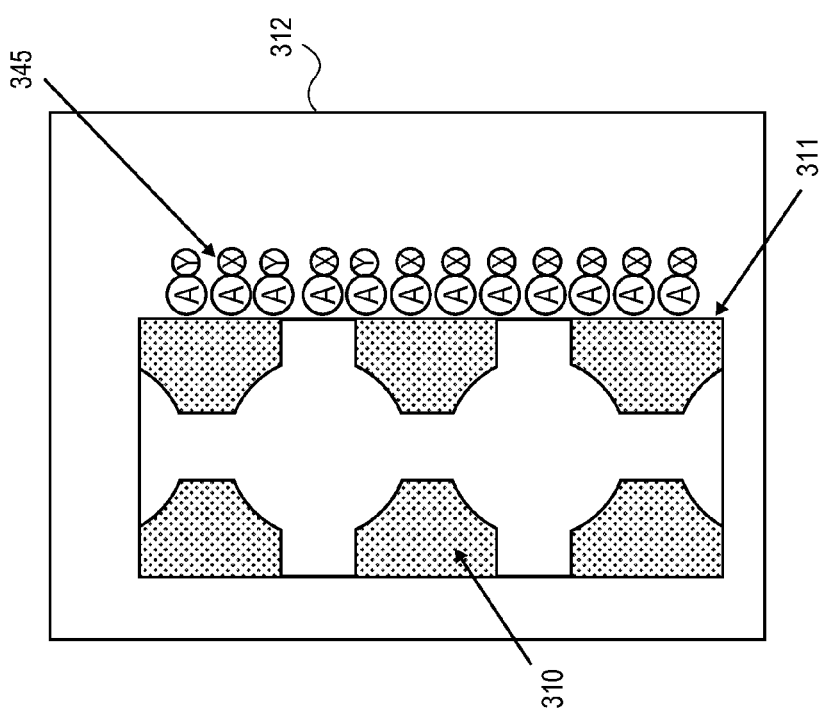
Figure 7F:
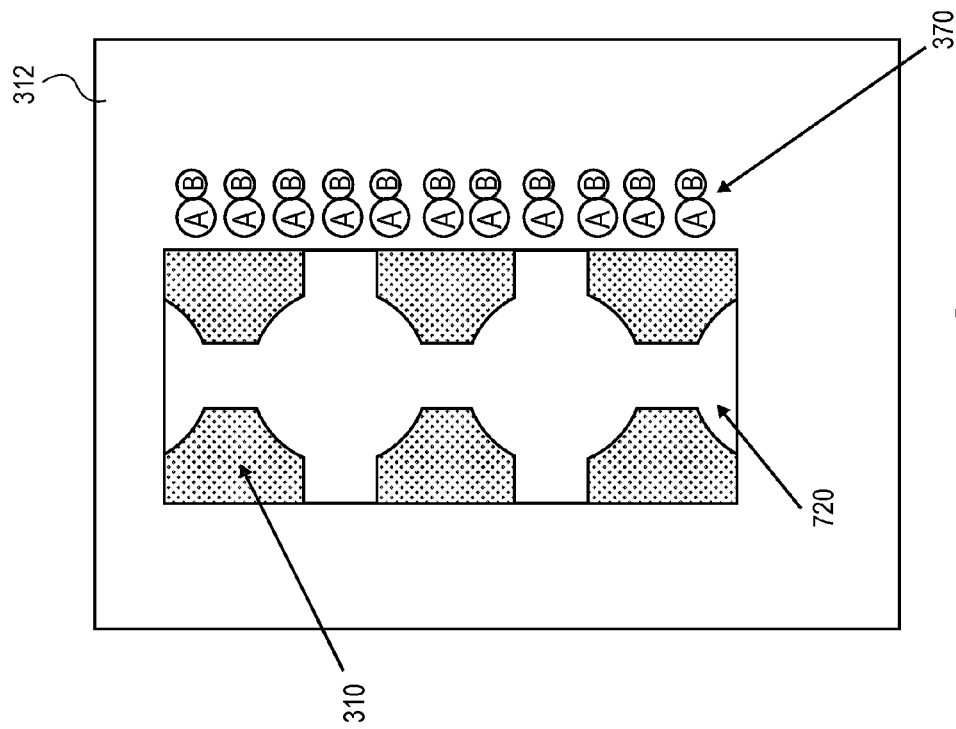
Figure 7E:
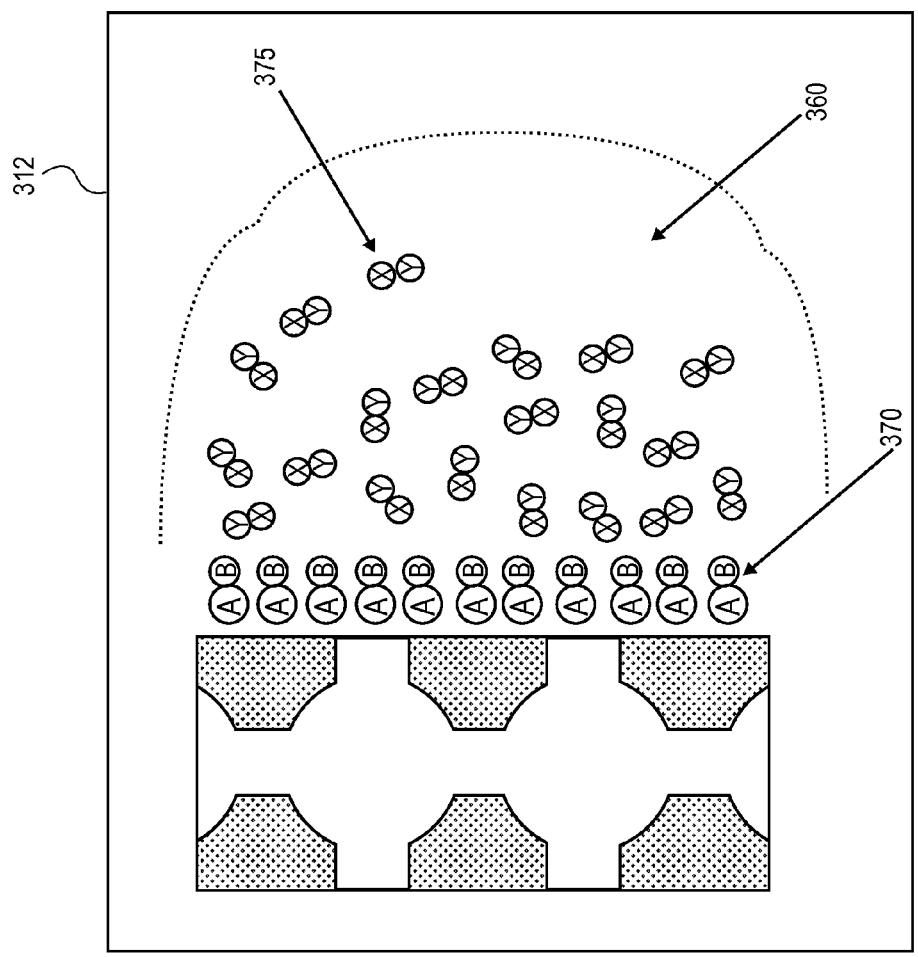

In another exemplary embodiment, a pore size reducing layer can be formed on a porous material to reduce the size of the pores and/or change the chemistry of the pores. FIG. 6 is a cross sectional schematic drawing of a portion of a porous material 610 that includes a plurality of pores 620 having a diameter of about $D_1$ or larger. A first pore reducing layer 631 can be formed using PA-ALD as disclosed herein. The first pore reducing layer 631 can reduce the pore diameter from $D_1$ to $D_2$, where $D_1 > D_2$. In various embodiments, a second pore reducing layer 632 can be formed using PA-ALD over first pore reducing layer 631. Second pore reducing layer 632 can further reduce the pore diameter from $D_2$ to $D_3$, where $D_2 > D_3$. According to various embodiments, first pore reducing layer 631 and/or second pore reducing layer 632 can further change chemistry in the pores. Further pore reducing layers are contemplated to reduce the pore size as desired.

In this manner, the plasma-assisted surface-limited deposition of ultra-thin layers, such as the conformal formation of the barrier layer 230 of FIGS. 2 and 370 of FIGS. 3E-3F, on porous supports can be used for sealing low k dielectrics.

In various embodiments, the plasma-assisted surface-limited deposition of ultra-thin layers can be used to form a selectively permeable membrane including hybrid and/or microporous membranes on the porous support layer, such as the layer 210, 310 or 610 of FIG. 2, FIGS. 3A-3F, or FIG. 6, respectively. In various embodiments, the structures, devices and methods shown in FIGS. 3A-3F and in FIG. 6 can be alternatively depicted as in FIGS. 7A-7F and in FIG. 8, respectively. For example, in FIGS. 7A-7F, the porous support 310 can include plurality of pores 720 that are, partially or wholly, connected with one another in the porous matrix 310. Note that, for simplicity purpose, any adsorption and/or desorption of chemical Ax and/or By within interior pores 320 or 720 in FIGS. 3A-3F and/or FIGS. 7A-7F is not shown.

Figure 8:
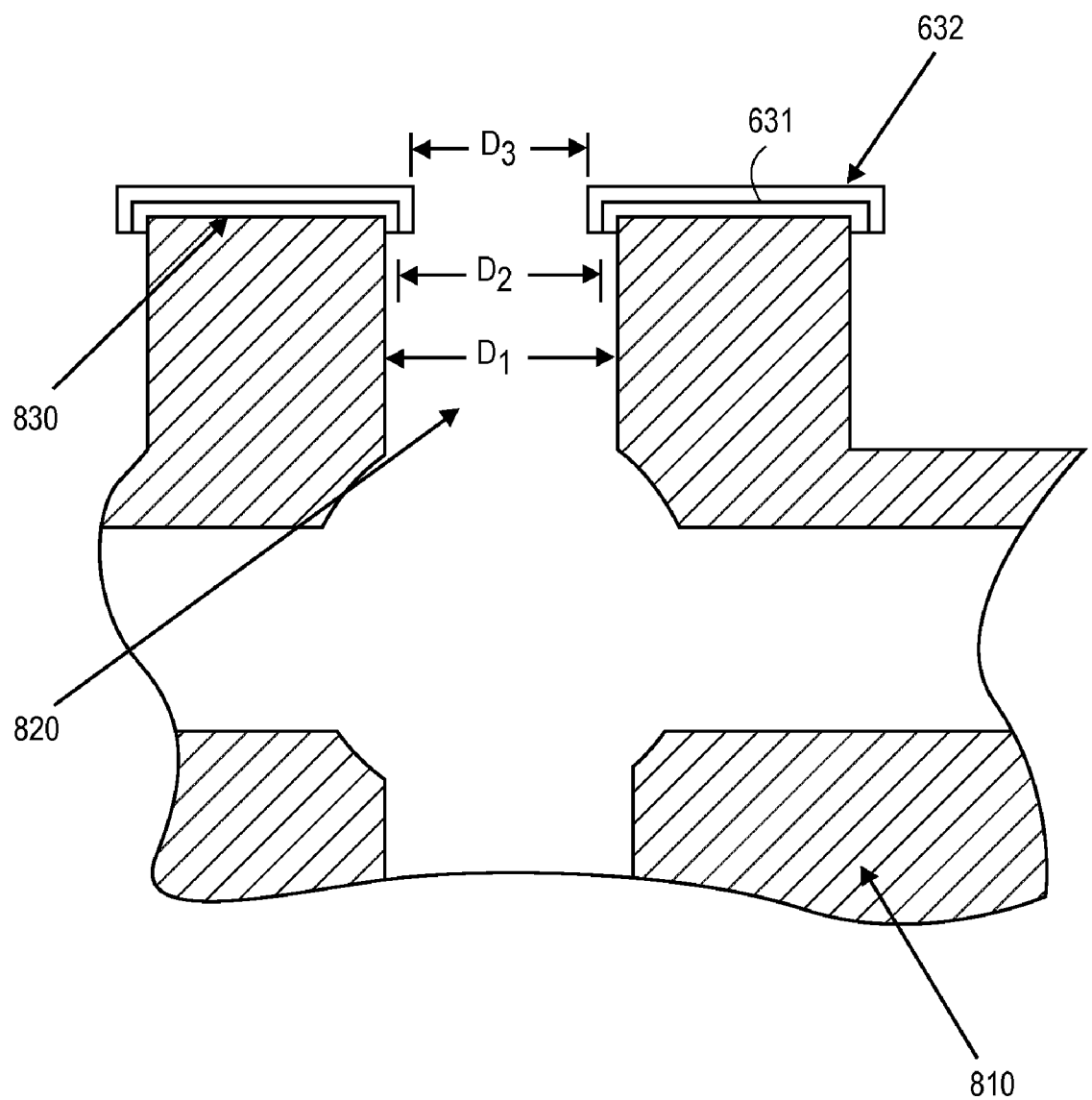
FIG. 8 is a cross sectional view of a method for reducing the diameter and/or the chemistry of pores in a porous material, which is relative to FIG. 6 in accordance with the present teachings.

In FIG. 8 (in relative to FIG. 6), a porous material 810 can include a plurality of pores 820, wherein an exemplary pore portion that is adjacent to the to-be-deposited surface 830 has a diameter of about D1 or larger, as shown. The first pore reducing layer 631 having a diameter of D2, as described in FIG. 6, can then be formed, followed by the formation of the second pore reducing layer 632 having a diameter of D3, where D1>D2>D3. Further pore reducing layers are contemplated to reduce the pore size as desired.

In various embodiments, ultra-thin hybrid and/or microporous material(s) can be formed on the porous support and can be useful for a variety of applications including, but not limited to, membrane, barrier layers, dielectric layers, low k dielectric layers, or sensors. In various embodiments, ultra-thin hybrid and/or microporous material(s) can be porous or non-porous (dense), patterned or non-patterned.

For example, the ultra-thin hybrid and/or microporous materials can include robust, pinhole-free ultra-thin membranes, with thicknesses controlled at, for example, a several nanometer level, can be formed on a mesoporous support in accordance with the present teachings. By reducing the membrane thickness, for example, by a fact of a hundred from the micron level for conventional membranes especially polymer membranes, to the nanometer level, the exemplary membranes can provide substantial improvements in membrane permeances.

In some embodiments, the surface-limited ultra-thin sealing layers formed on porous supports can include hybrid organic/inorganic membranes. In other embodiments, the surface-limited ultra-thin sealing layers formed on porous supports can include microporous membranes possessing high permeance and high separation selectivity, for example, by removal of organic pore templates from the ultra-thin layer.

The exemplary hybrid membrane can include a robust inorganic matrix and functional organic groups. The organic groups can, for example, serve to selectively deliver specific molecules and/or ions, or can serve to create homogeneous sub-micro or sub-nano meter porosities.

For example, organic groups in the exemplary hybrid membranes can be designed to possess certain functions as many polymers do, for example, to selectively deliver specific species such as water, oxygen or proton. Alternatively, the organic groups can work as porogens to create homogeneous sub-micro and/or sub-nano porosities when removed by UV or thermal treatment. The resulting sub-micro and/or sub-nano pores can be uniform in dimension and well-suited for applications such as gas separation, water purification, ion/proton conduction, sensors and/or energy conversions.

In various embodiments, the exemplary ultra-thin hybrid membranes can be formed including, for example, successive surface activation and reaction steps. The surface activation can be performed using, for example, remote plasma exposure, to locally activate the porous support of the disclosed membrane. Following the surface activation, ALD reaction can be conducted between the organic/inorganic hybrid precursors such as organometallic silane precursors and a corresponding reactant.

Figure 9:
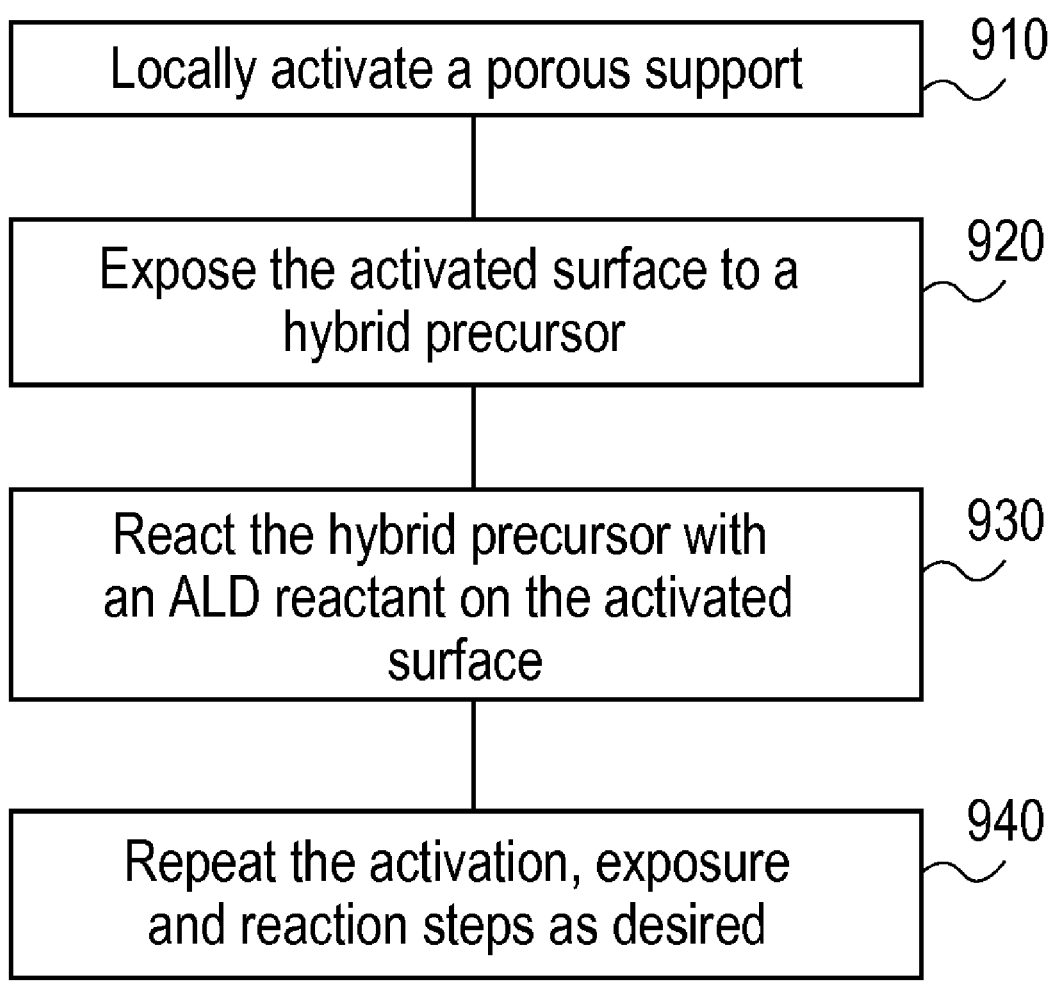
FIG. 9 depicts an exemplary method for forming an ultra-thin material in accordance with the present teachings.

FIG. 9 depicts an exemplary method 900 for forming an ultra-thin membrane in accordance with the present teachings. While the exemplary method 900 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the present teachings. In addition, not all illustrated steps may be required to implement a methodology in accordance with the present teachings.

At 910, a porous support can be provided and treated, e.g., locally activated, for the preparation of the disclosed membrane. In various embodiments, such treatment can include, for example, preparing a hierarchical porous support having hydroxylated surfaces, followed by passivating and locally activating the prepared hydroxylated hierarchical porous support.

Figure 11:
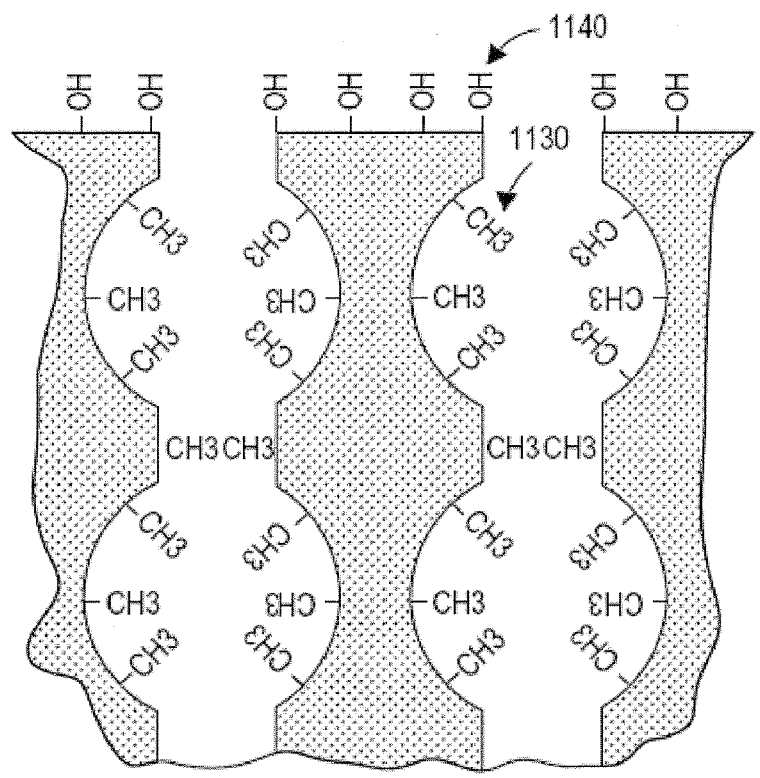
FIG. 11 depicts a close-up view for an local activation on a porous support in accordance with the present teachings.

For example, the porous support can be treated to locally or selectively provide activated region on the exterior surface of the porous support, while the internal pore surfaces of the porous matrix can be non-activated, or passivated (also see FIG. 11). The surface activation can be obtained by, for example, a remote plasma irradiation on the exterior surface of a passivated porous substrate to confine location of subsequent deposition to the very exterior surface of the porous support.

To provide a hierarchical porous support having hydroxylated surfaces, a top porous layer such as a silica layer can be formed overlaying a bottom porous layer, such as an alumina layer or a silica layer. In various embodiments, the bottom porous layer can have larger pore dimensions than the top porous layer. In an exemplary embodiment, the top porous layer can possess an ordered cubic arrangement of monosized pores having a diameter of about 3-nm, formed by evaporation-induced self-assembly on an underlying anodized alumina support having a diameter of about 20-nm. The pores for the top porous layer and/or the bottom layer can be aligned normal to the support surface. By calcination and/or UV/ozone exposure, the exemplary porous support can be surface hydroxylated.

To passivate the porous support for avoiding ALD on any interior porosities, which can detrimentally increase the membrane thickness, the porous support can be passivated by, for example, modifying the exterior or internal porous surfaces with an alkyl group such as —$CH_3$, or other chemistries so that the surface and any internal porosity become "inert" to the ALD precursors used herein. For example, the hierarchical porous support can be exposed to hexamethydisilazane (HMDS) vapor and then to trimethychlorosilane (TMCS) vapor to convert the reactive surface Si—OH groups to hydrophobic trimethylsiloxane groups (Si—O—Si($CH_3$)$_3$), which remain inert to hydrolysis reactions and therefore passivate the surface against the ALD during subsequent processes.

To locally activate exterior surfaces (e.g., the top surface) of the passivated porous support, a remote plasma irradiation can be used. For example, the passivated porous sample can be exposed to remote plasma radicals including Ar and $O_2$ for about 2 seconds. The exemplary plasma can be designed as "remote plasma" or a "remote plasma radiation" so that its Debye length (e.g., about several mm) and radical mean free path (e.g., about several mm) can be much larger than the pore size of the top porous layer. In this condition, the plasma radicals can avoid penetration into internal porosities, and only the exemplary trimethylsiloxane groups, Si—O—Si($CH_3$)$_3$, the "inert" ligands residing on the immediate exterior surface of the porous support, can be converted or activated to silanols, ≡Si—OH. The activated exterior surface can thus have surface active sites, while the internal surfaces of the porous matrix can still be untouched and "inert".

At 920, the locally activated porous support can then be exposed to ALD hybrid precursor(s) for preparing the disclosed membrane.

In various embodiments, the ALD hybrid precursors can include any precursors that can form hybrid organic/inorganic membranes by ALD processes on the activated porous support. The ALD hybrid precursors can react (e.g., condense) with the active sites (e.g., ≡Si—O— groups) of the treated porous support. The ALD processes can further include a reactant (see 930 in FIG. 9) to react with the hybrid precursors, using principles as similarly described in FIGS. 3A-3F.

In various embodiments, the ALD hybrid precursors can include active ligands and inert organic ligands. For example, the ALD hybrid precursor can include two or more active ligands, such as halide ligands denoted as "—X", or alkoxide ligands denoted as "—OR", wherein the ALD hybrid precursor can be terminated with —Cl, —$OCH_3$, or —$OC_2H_5$ in its molecular structure. Meanwhile, the ALD hybrid precursor can also include one or more relatively inert organic ligands R', such as alkyl groups, aromatic groups or derivatives thereof. For example, the ALD hybrid precursor can be terminated with R' including —CH$_3$, —C$_2$H$_5$, —C$_6$H$_5$, or bridged with R' including —CH$_2$—, —C$_2$H$_4$—, or —C$_6$H$_4$—.

The ALD hybrid precursors can thus include, but are not limited to, organometallic silane, bridged organometallic silanes, organically bridged silsequoxane, trialkoxysilanes, chlorosilanes, and/or other organosilane precursors. In an exemplary embodiment, the ALD hybrid precursor can be an organically bridged silsequoxane represented by a formula of (X)$_3$Si—R'—Si(X)$_3$ or (RO)Si$_3$—R'—Si(OR)$_3$ including, but not limited to, BTEE (bis(triethoxysilyl)ethane, (C$_2$H$_5$-O)$_3$—Si—C$_2$H$_4$—Si—(OC$_2$H$_5$)$_3$), Bis(triethoxysilyl)ethane ((-CH$_2$Si(OC$_2$H$_5$)$_3$)$_2$), Bis(triethoxysilyl)benzene(C$_6$H$_4$-(Si(OC$_2$H$_5$)$_3$)$_2$), 4,4'-Bis(triethoxysilyl)-1,1'-biphenyl((C$_6$-H$_4$Si(OC$_2$H$_5$)$_3$)$_2$) or CH$_3$Si(OC$_2$H$_5$)$_3$.

In various embodiments, the ALD hybrid precursors can include other organosilane precursors represented by a formula of, such as, for example, R'—SiX$_3$, R'—Si(OR)$_3$, and (R'—SiX$_2$)$_2$O, R'$_n$SiX$_{4-n}$; wherein R' can be an inert organic ligand such as an alkyl group or the like; X can be a halide ligand or the like; OR can be an alkoxide ligand or the like; and n can be an integer of 4 or less.

The inert organic ligands R' can be used as molecular-sized pore templates, so-called porogens. When the inert organic ligands R' is introduced within a dense, ultra-thin sealing layer, their removal can create a corresponding ultra-thin microporous membrane with controlled pore size and shape.

The hybrid precursors can be gaseous or volatile, and can be exposed to, e.g., an activated porous support placed in an ALD chamber. In various embodiments, prior to the precursor exposure, the ALD chamber can be evacuated to a base vacuum to provide a vacuum environment. The chamber can then be pumped down to a good vacuum to remove adsorbed contaminations on the support surface.

Following the precursor introduction, the precursor reaction with the surface active sites, and the precursor deposition, the chamber can then be purged with an inert gas or evacuated, so that only one monolayer or submonolayer of precursor molecules is left on the exterior support surface. In various embodiments, short precursor exposure and short chamber purge time can be used to reduce the deposition that may penetrate into the internal porous matrix.

At 930, ALD deposition can take place on the exterior surface of the porous support by reacting the hybrid precursors deposited at 920 with a reactant, whereby forming a solid deposition, for example, one atomic monolayer (or in some cases one sub-monolayer). The reactant can be a gaseous or volatile reactant and can be introduced into the ALD chamber to undergo the ALD reactions. Internal passivated hydrophobic surfaces, e.g., having surface ligands of —Si(CH$_3$)$_3$, remain unhydrolized, i.e., unactivated, with no condensation reactions with the hybrid precursors and with no ALD reactions with the reactant.

The ALD reactants can include, but are not limited to, O$_2$, H$_2$O vapor, H$_2$O$_2$ vapor, H$_2$, or some silanes with —OH groups in their molecular structure. In various embodiments, volatile products can also be formed from the ALD reaction and the chamber can again be purged with an inert gas or evacuated so that residual reactant gases and products can be removed, leaving a clean surface covered with the atomic monolayer or submonolayer from the reaction of the hybrid precursor(s) and the reactant(s).

According to various other embodiments, the porous support may be heated. To achieve better function for the organic groups, additional treatment steps can be inserted prior to purging the chamber with the inert gas. The additional treatment can include, for example, sulfonating benzene rings in the ALD deposition to produce sulfonic acid if proton conductivity is desired.

At 940, according to various embodiments, the above described deposition cycle, for example, including steps of 910, 920 and 930 can be repeated as desired to produce a desired thickness of the ALD depositions for the disclosed hybrid and/or microporous membrane.

In various exemplary embodiments, intermittent replacement of hybrid precursors can be performed in order to enhance the hybrid molecular network. For example, the hybrid precursors having a general formula of (RO)$_3$Si—R'—Si(OR) such as BTEE, R'—SiX$_3$, R'—Si(OR)$_3$, (R'—SiX$_2$)$_2$O, or R'$_n$SiX$_{4-n}$, can be used for the first one or more deposition cycles, wherein R' is an inert organic ligand comprising an alkyl group; X is a halide ligand; OR is an alkoxide ligand; and n is an integer of 4 or less.

Secondary precursors, for example, with more active ligands in their molecular structures, can be used to replace the previous exemplary (RO)$_3$Si—R'—Si(OR) precursors. The precursors with more active ligands can include, for example, precursors with a general formula of M(X)$_n$ (e.g., SiCl$_4$ or TiCl$_4$), or M(OR)$_n$ (e.g., Si(OCH$_3$)$_4$) can be used for the second one or more deposition cycles, wherein M is a metal including Si, Ti, Zr, or Al; X is a halide ligand; OR is an alkoxide ligand; and n is an integer of 4 or less.

In this manner, ultra-thin hybrid membranes having a number of atomic monolayers or submonolayers can be formed through this intermittent replacement of precursors, for example, by replacing BTEE with TiCl$_4$ or ZrCl$_4$, thermal stability of the resulting membrane can be improved allowing high temperature operations.

In various embodiments, to obtain microporous membranes, the ALD sample from a number of deposition cycles, e.g., from the act 940 in FIG. 9 or from intermittent replacements, can be treated by UV or heat, so that the organic groups, such as the organic pore templates R', in the membrane can be removed, leaving sub-micro and/or sub-nano porosities.

In various embodiments, the hierarchical porous support can be a patterned porous support For example, the hierarchical porous support can include a mesoporous film (e.g., silica) formed by an evaporation-induced self-assembly process on a porous substrate (e.g., alumina) that has greater pore dimensions to provide a high flux. The hierarchical porous support can be patterned to have any topographical features including, but not limited to, trenches, vertical columns or their arrays. Ultra-thin hybrid and/or microporous materials can then be conformally formed on any activated surface of the desired topographical features.

In an exemplary embodiment, when the conformal ultra-thin hybrid and/or microporous materials are used as membranes, due to an increase of the effective area from the topographical features, the disclosed membrane can have high throughput. For example, FIGS. 10A-10B depict an exemplary device 1000 including ultra-thin hybrid and/or microporous materials formed on an activated patterned porous support in accordance with the present teachings.

Figure 10A:
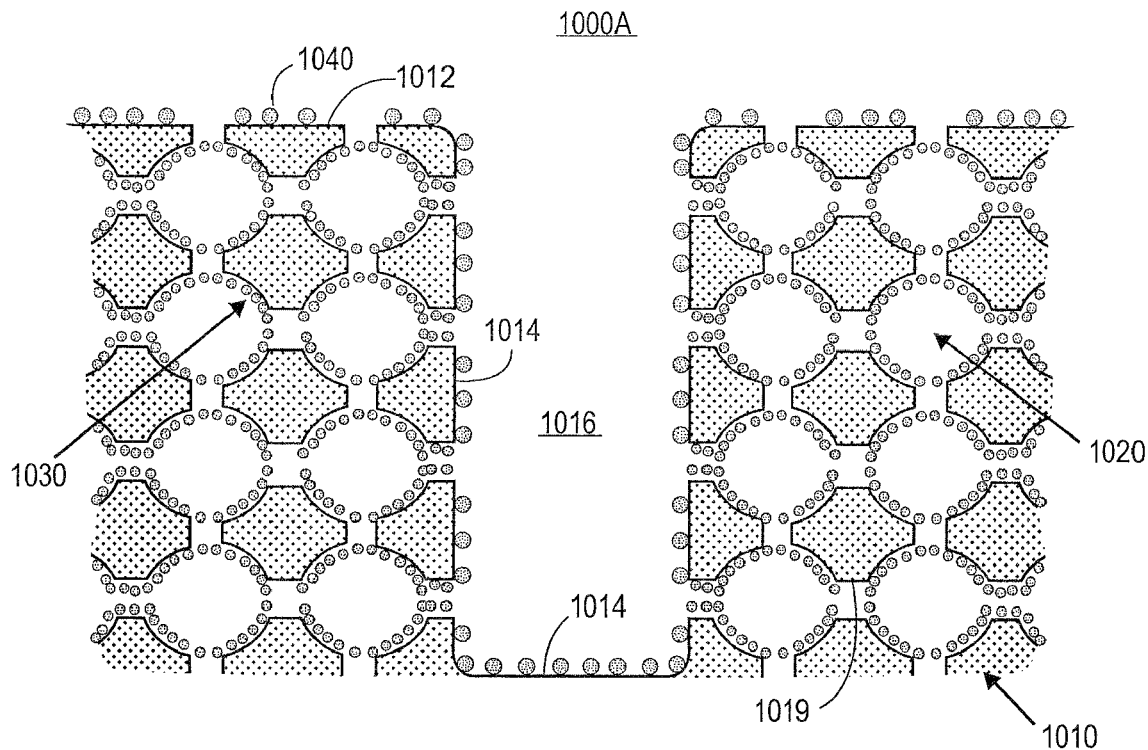
FIGS. 10A-10B depict an exemplary ultra-thin material formed on a patterned porous support in accordance with the present teachings.
Figure 10B:
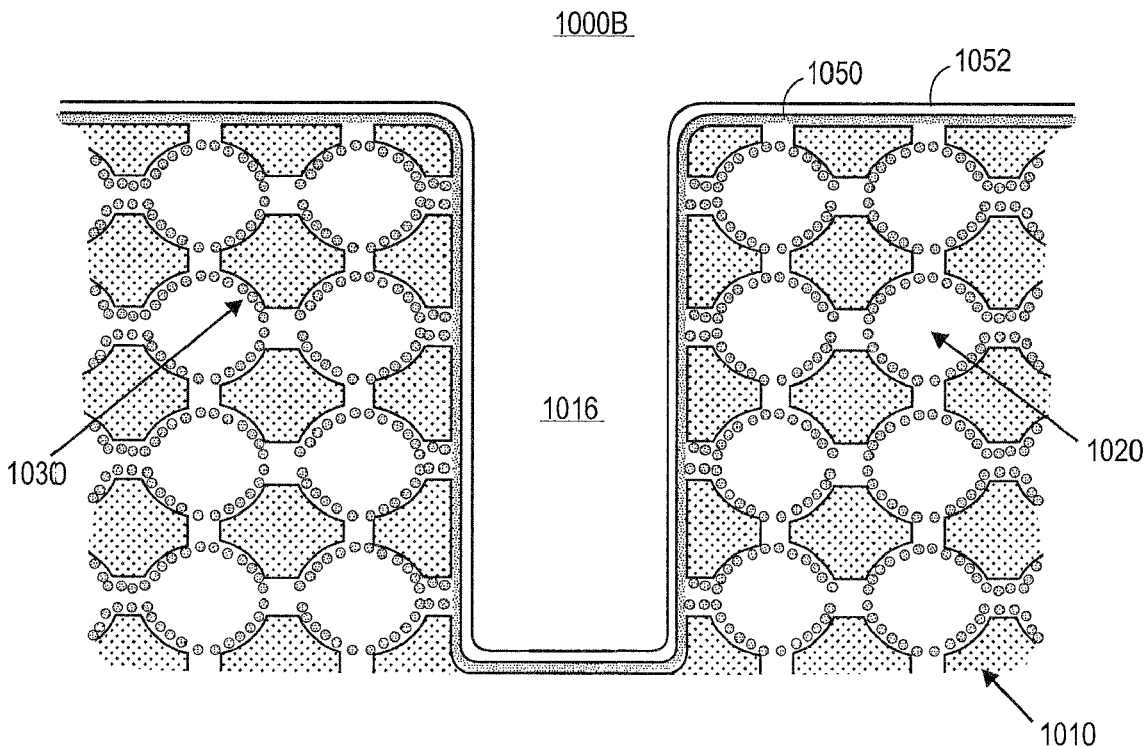

As shown in FIG. 10A, the device 1000A can include an exemplary pattern including a trench structure 1016 formed in a porous matrix 1010 that further includes a plurality of pores 1020. The porous matrix 1010 can include a top surface 1012 and a plurality of pore surfaces 1019. The trench structure 1016 can include trench surfaces 1014 including surfaces of "side walls" of the trench and the trench bottom.

As disclosed herein, for example, by using the passivation and activation methods described in FIG. 9, the device 1000A can be first passivated on each exterior surface (i.e., exposed surface) of the top surfaces 1012 and trench surfaces 1014 and the plurality of pore surfaces 1019. Following the passivation process, the device 1000A can be locally activated at 1040 on each exterior surface of the top surface 1012 and the trench surfaces 1014, while leaving the internal surfaces, i.e., the pore surfaces 1019 remain passivated at 1030 as shown.

In various embodiments, the exemplary trench structure can provide a high aspect ratio of, for example, about 1 or greater, such as about 10. While the effective area of the activated region and thus the formed thin layer material is proportional to the aspect ratio, the throughput of the resulting device can be increased by an order of magnitude or more.

FIG. 11 depicts a close-up schematic for a portion of a porous support, patterned or non-patterned, after the passivation and activation process in accordance with the present teachings. In this illustrative example, the locally activated exterior surface can include active sites of —OH groups at 1140 and the passivated internal pore surfaces can include non-active sites of —CH$_3$ groups at 1130.

Referring back to FIGS. 10A-10B, in FIG. 10B, ALD ultra-thin layers 1050 and 1052 can be formed on the activated surfaces using the disclosed ALD process, for example, as described in FIG. 9.

The following examples of exemplary methods for forming organic/inorganic hybrid thin films (or membranes) by ALD are provided. One of ordinary skill in the art will understand that the examples provided are exemplary and that other steps can be added or existing steps can be removed or modified while still remaining within the spirit and scope of the present teachings.

Example I

Preparation of Hydroxylated Hierarchical Porous Support

The porous support included a porous alumina support, e.g., a 20-nm Anodisc™ from Whatman. The porous alumina support included two layers having a top layer overlaying a bottom layer. The top layer had 20 nm-diameter cylindrical pores aligned normal to the bottom support surface and is only ~0.5 micron thick. The bottom structural layer was ~50 µm thick and had 100 nm-diameter cylindrical pores, which supported high flux.

To create hierarchical porous support, an ordered mesoporous film was formed on the anodisc porous alumina support by spin-coating for twice with an acid-catalyzed silica sol containing the non-ionic surfactant, Brij 56 as described herein. Evaporations occurred during the spin-coating processes, which drives self-assembly of an ordered, 3D cubic mesostructured film. The first coating was made with a dilute sol solution. Such evaporation induced self-assembly process performed with this dilute sol concentrated film deposition at the top layer of the anodisc, filling into the pores, and preventing penetration of the following second mesoporous film. The second mesoporous layer provided a very smooth surface and healed defects, as observed by corresponding TEM cross-section (not shown). The deposited film was heated to 120° C. at 1° C./min and maintained at 120° C. for 12 hours to promote siloxane condensation reactions. To remove surfactant and achieve fully hydroxylated pore surfaces, the formed porous support was treated with UV/ozone for 120 minutes.

Example II

Surface Passivation and Local Activation by Remote Plasma Radiation

The hydroxylated exterior surfaces and hydroxylated internal surfaces of the porous support were passivated by covering all of the surfaces with the passive group of —Si—(CH$_3$)$_3$. The passivation was conducted by treating the hydroxylated hierarchical porous support with hexamethyldisilazane (HMDS) vapor and then with trimethychlorosilane (TMCS) vapor as disclosed herein. These two vapors worked complementarily to ensure a maximum conversion of reactive surface Si—OH groups to hydrophobic Si—O—Si (CH$_3$)$_3$ groups.

Surface activation was carried out with a remote Ar+O$_2$ (Ar:O$_2$=15 sccm:5 sccm) plasma for 2 seconds. The sample was positioned in the downstream plasma that was ~20 cm away from the main discharging zone, and the estimated plasma Debye length was ~2 mm. The activation was confined to the immediate exterior surfaces and directed ALD to occur there exclusively.

Example III

Preparation of BTEE-Based Hybrid Membranes

In this example, BTEE (bis(triethoxysilyl)ethane, (C$_2$H$_5$O)$_3$—Si—C$_2$H$_4$—Si—(OC$_2$H$_5$)$_3$) was used as ALD precursor. Following remote plasma exposure to activate the porous substrate as described in Examples I-II, ALD process was performed in an ALD reactor according to the following steps: (a) The ALD chamber was evacuated to a base vacuum of about $10^{-6}$ Torr; (b) BTEE vapor was introduced into the vacuum chamber with a duration time of 50 seconds, causing reaction with ≡Si—OH groups of the activated surface and forming a chemisorbed layer on the sample surface; (c) The chamber was purged by Ar flow for 120 seconds to remove all non-condensed BTEE and condensation by-products, leaving a monolayer (or submonolayer) of chemisorbed BTEE molecules on the sample surface; (d) H$_2$O vapor was introduced into the chamber, reacting with the chemisorbed BTEE molecules (i.e., to hydrolyze the ethoxysilane groups of surface chemisorbed BTEE), to form —(CH$_2$)$_2$— bridged silicon dioxide with —OH groups exposed at the surface sites; (e) The chamber was purged with Ar again to remove all the products and residual reactant gases (e.g., water vapor and ethanol by-products); (f) The steps (a)-(e) were repeated for a number of times to achieve desired membrane thickness. In this manner, a hybrid organic/inorganic membrane was formed on the hierarchical porous support.

In some examples, the ALD hybrid organic/inorganic membrane sample was then removed from the ALD deposition chamber, and irradiated with UV lamp and/or ozone for 2 hours at a distance of 15 cm so that, the organic C2 templates, i.e., —(CH$_2$)$_2$ groups were oxidatively removed, forming angstrom sized pores in the membrane.

Figure 12:
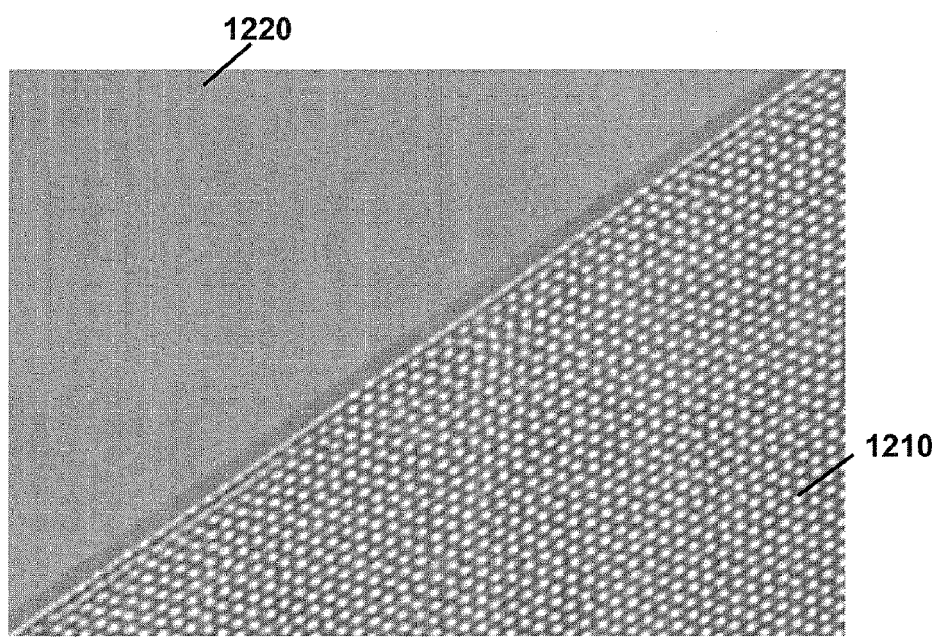
FIG. 12 depicts a schematic for cross-sectional view of an exemplary nanoporous supported ALD membrane in accordance with the present teachings.

For example, FIG. 12 shows a schematic of a cross-sectional view of an exemplary nanoporous supported ALD membrane in accordance with the present teachings. In this example, the ALD membrane 1220 can be prepared by 300 cycles of ALD processes with each cycle including steps (a)-(e) as described above and followed by UV/ozone exposure to remove the organic C2 templates. The ALD hybrid membrane 1220 was smooth and ultra-thin having a thickness of about 5-nm thick. The ALD hybrid membrane 1220 spanned the ~3-nm diameter pores of the underlying support 1210. The ALD hybrid membrane 1220 was confined to the immediate surface of the porous support 1210 with no penetration into the nanoporous sublayer 1210.

To demonstrate the selectivity of the prepared ALD membranes, with organic pore templates removed by 30 seconds of UV/ozone exposure, the permeance of the ALD membranes to various gases, such as He, $N_2$, and $SF_6$, was measured at room temperature using standard techniques. Exemplary results indicated that a defect-free, pore-spanning sealing layer of several nanometer thickness was formed prior to the template removal. In addition, the permeance decreased with increasing cycle numbers, while the selectivity increased logarithmically, for example, after 100 cycles.

Example IV

Preparation of Enhanced BTEE-Based Hybrid Membrane Using a Secondary Precursor

A mesostructured silica film was coated on porous anodized alumina disc by an evaporation induced self-assembly process and calcinated to produce a supported mesoporous film of ~150 nm thick with ~3 nm pores. This film was used as the membrane support and was placed in a vacuum chamber and heated to 250° C. for 3 hrs. Then, this porous support was pretreated with HMDS vapor and TMCS vapor and then with remote plasma radiation by the procedure described in Examples I-III.

After that, the support sample was maintained at 180° C. and ALD was conducted by the following steps: (a) BTEE vapor was introduced into the vacuum chamber with a duration time of 50 seconds, causing reaction with —OH groups and forming a chemisorbed layer on the sample surface; (b) The chamber was purged by Ar flow for 120 seconds, leaving a monolayer (or submonolayer) of chemisorbed BTEE molecules on the sample surface; (c) $H_2O$ vapor was introduced into the chamber, reacting with the chemisorbed bis(triethoxysilyl)ethane molecules, to form —$(CH_2)_2$—bridged silicon dioxide, with —OH groups exposed at the surface sites; (d) The chamber was purged with Ar again to remove all the products and residual reactant gases; (e) Steps (a)-(d) were repeated once again. All procedures were similar to those described in the Examples I-III.

Following these repeated steps, step (f) was conducted to repeat steps (a)-(d) again, but $TiCl_4$ was used to replace BTEE as the precursor. Steps (a)-(f) were repeated for 3 times.

After the procedure above, a thin membrane layer of silica embedded with —$(CH_2)_2$— and titania was formed on the mesoporous silica support. Then the sample was removed from the deposition chamber, and irradiated with UV lamp for 2 hours at 15 cm distance so that —$(CH_2)_2$ groups were oxidatively removed, forming angstrom sized pores in the membrane.

The permeances of He, $N_2$, $CO_2$ and $SF_6$ gases through this microporous membrane were measured at room temperature. It was found that the membrane such made had a selectivity of He/$N_2$ of 30, $CO_2$/$N_2$ of 23, with a respectable He flux of 14.4 sccm/cm$^2$-min-atm, $CO_2$ flux of 12.0 sccm/cm$^2$-min-atm, and no $SF_6$ penetration was detected after 2 hours. Water purification experiments were also carried out with the same membrane, and 77% salt rejection was observed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a material comprising:
passivating a porous support comprising an exterior surface and a plurality of internal pore surfaces such that at least the plurality of internal pore surfaces are inert to a hybrid precursor;
locally activating the exterior surface of the porous support using a remote plasma irradiation, wherein the plurality of internal pore surfaces remain inert to the hybrid precursor; and
depositing the hybrid precursor on the locally activated exterior surface using an atomic layer deposition (ALD) process, wherein the deposited hybrid precursor reacts with a reactant to form the material layering on the exterior surface of the porous support but not on the plurality of internal pore surfaces.

2. The method of claim 1, further comprising forming a hierarchical porous support by forming a mesoporous film using evaporation-induced self-assembly on a porous substrate, wherein the mesoporous film comprises alumina or silica and the porous substrate comprises alumina or silica.

3. The method of claim 1, further comprising forming a topographic feature on the porous support to increase an area of local activation, wherein the topographic feature comprises a trench structure with each surface of a plurality of side walls and a trench bottom being activated for forming the material layering on the exterior surface.

4. The method of claim 1, wherein the step of passivating comprises hydroxylating the exterior surface and the plurality of internal pore surfaces of the porous support; and passivating the hydroxylated surface; and wherein the step of locally activating comprises applying the remote plasma irradiation locally on the passivated exterior surface leaving the plurality of internal pore surfaces passivated.

5. The method of claim 4, wherein the step of hydroxylating comprises exposure to UV or ozone.

6. The method of claim 1, wherein the step of passivating comprises preparing a hydroxylated porous support comprising one or more hydroxyl-groups (—OH) on each surface of the exterior surface and the plurality of internal pore surfaces; passivating each surface with one or more non-active groups comprising an alkyl-group; and wherein the step of locally activating the exterior surface comprises using the remote plasma radiation to convert non-active groups on the exterior surface into active groups for the deposition of the hybrid precursor.

7. The method of claim 1, wherein the hybrid precursor comprises a general formula comprising $(X)_3Si$—R'—$Si(X)$, $(RO)_3Si$—R'—$Si(OR)_3$, R'—$SiX_3$, R'—$Si(OR)_3$, $(R'$—$SiX_2)_2O$, $R'_nSiX_{4-n}$, $M(X)_n$, or $M(OR)_n$, wherein R' is an inert organic ligand comprising an alkyl, an aromatic group or derivatives thereof; X is a halide ligand or an active ligand being capable of reacting with the activated exterior surface; OR is an alkoxide ligand; M is a metal comprising Si, Ti, Zr, or Al, and n is an integer of 4 or less.

8. The method of claim 1, wherein the hybrid precursor comprises one or more inert organic ligands R' comprising an alkyl group and two or more active ligands comprising a halide ligand, or an alkoxide ligand; wherein the hybrid precursor is terminated or bridged with the one or more inert organic ligands R' comprising —$CH_3$, —$C_2H_5$, —$C_6H_5$, —$CH_2$—, —$C_2H_4$—, or —$C_6H_4$—.

9. The method of claim 1, wherein the hybrid precursor comprises one or more of $TiCl_4$, $ZrCl_4$, BTEE (bis(triethoxysilyl)ethane, $(C_2H_5O)_3$—Si—$C_2H_4$—Si—$(OC_2H_5)_3$), Bis(triethoxysilyl)ethane (($—CH_2Si(OC_2H_5)_3)_2$), Bis(triethoxysilyl)benzene ($C_6H_4(Si(OC_2H_5)_3)_2$), or 4,4'-Bis(triethoxysilyl)-1,1'-biphenyl(($—C_6H_4Si(OC_2H_5)_3)_2$) or $CH_3Si(OC_2H_5)_3$).

10. The method of claim 1, wherein the reactant comprises one or more of $O_2$, $H_2O$, $H_2O_2$, $H_2$, or a silane with one or more hydroxyl groups.

11. The method of claim 1, further comprising sulfonating a benzene ring of the material formed on the locally activated exterior surface to obtain sulfonic acid for providing proton conductivity.

12. The method of claim 1, further comprising treating the material layering on the exterior surface with an energy source comprising a UV source or a heat source to form a porous material layering on the exterior surface.

13. A method for forming a material comprising:
(a) passivating a porous support comprising an exterior surface and a plurality of internal pore surfaces such that at least the plurality of internal pore surfaces are inert to a hybrid precursor and a secondary precursor;
(b) locally activating the exterior surface of the porous support using a remote plasma irradiation, leaving the plurality of internal pore surfaces remain inert;
(c) depositing the hybrid precursor on the locally activated exterior surface;
(d) reacting the deposited hybrid precursor with a reactant to form a first type of layer on the exterior surface of the porous support;
(e) repeating steps (c)-(d) to form one or more additional first type of layers on the first type of layer on the exterior surface of the porous support;
(f) depositing the secondary precursor on the activated local surface of the one or more additional first type of layers;
(g) reacting the deposited secondary precursor with a reactant to form a second type of layer on the one or more additional first type of layers; and
(h) repeating steps of (f)-(g) to form one or more additional second type of layers on the second type of layer on the one or more additional first type of layers.

14. The method of claim 13, wherein the hybrid precursor comprises a general formula of $(X)_3Si$—R'—$Si(X)$, $(RO)_3Si$—R'—$Si(OR)_3$, R'—$SiX_3$, R'—$Si(OR)_3$, $(R'—SiX_2)_2O$, or $R'_nSiX_{4-n}$, wherein R' is an inert organic ligand comprising an alkyl group, an aromatic group or derivtives thereof; X is a halide ligand or any active ligand being capable reacting with the activated exterior surface; OR is an alkoxide ligand; and n is an integer of 4 or less.

15. The method of claim 13, wherein the secondary precursor comprises a general formula of $M(X)_n$ or $M(OR)_n$, wherein M is a metal comprising Si, Ti, Zr, or Al; X is a halide ligand; OR is an alkoxide ligand; and n is an integer of 4 or less.

16. The method of claim 13, further comprising forming a porous material by treating the first type of layers and the second type of layers with an energy source comprising a UV source and a heat source.

17. A method of making a material comprising:
providing a hybrid precursor and a secondary precursor for an atomic layer deposition (ALD) process, wherein the hybrid precursor comprises a general formula of $(X)_3Si$—R'—$Si(X)$, $(RO)_3Si$—R'—$Si(OR)_3$, R'—$SiX_3$, R'—$Si(OR)_3$, $(R'—SiX_2)_2O$, $R'_nSiX_{4-n}$, wherein R' is an inert organic ligand comprising an alkyl group, an aromatic group or derivatives thereof; X is a halide ligand or an active ligand for the ALD process; OR is an alkoxide ligand; and n is an integer of 4 or less, and wherein the secondary precursor comprises a general formula of $M(X)_n$ or $M(OR)_n$, wherein M is a metal comprising Si, Ti, Zr, or Al; X is a halide ligand; OR is an alkoxide ligand; and n is an integer of 4 or less; and
forming a hybrid molecular network on a support by the ALD process comprising intermittently replacing the hybrid precursor with the secondary precursor.

18. The method of claim 17, further comprising sulfonating a benzene ring of the ALD-deposited hybrid molecular network formed on the support to obtain sulfonic acid for providing proton conductivity.

19. The method of claim 17, further comprising treating the ALD-deposited hybrid molecular network with an energy source to generate porosity in the hybrid molecular network, wherein the energy source comprises a UV source or heat source.

20. The method of claim 17, wherein the secondary precursor comprises $TiCl_4$ and TMOS and wherein the hybrid precursor comprises BTEE.

* * * * *